US009437620B2

(12) United States Patent
Tsurume et al.

(10) Patent No.: US 9,437,620 B2
(45) Date of Patent: Sep. 6, 2016

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Takuya Tsurume, Atsugi (JP); Yoshitaka Dozen, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/718,701

(22) Filed: May 21, 2015

(65) Prior Publication Data
US 2015/0255489 A1 Sep. 10, 2015

Related U.S. Application Data

(60) Continuation of application No. 14/050,634, filed on Oct. 10, 2013, now Pat. No. 9,059,098, which is a division of application No. 12/971,918, filed on Dec. 17, 2010, now Pat. No. 8,557,699, which is a division of application No. 11/486,135, filed on Jul. 14, 2006, now Pat. No. 7,863,188.

(30) Foreign Application Priority Data

Jul. 29, 2005 (JP) .................................. 2005-222199

(51) Int. Cl.
*H01L 29/40* (2006.01)
*H01L 27/12* (2006.01)
(Continued)

(52) U.S. Cl.
CPC ........... *H01L 27/124* (2013.01); *H01L 21/304* (2013.01); *H01L 27/1218* (2013.01);
(Continued)

(58) Field of Classification Search
None
See application file for complete search history.

(56) References Cited

U.S. PATENT DOCUMENTS 5,166,556 A   11/1992   Hsu et al.
5,581,385 A   12/1996   Spitzer et al.
(Continued)

FOREIGN PATENT DOCUMENTS

JP   05-152529 A   6/1993
JP   08-220560 A   8/1996
(Continued)

OTHER PUBLICATIONS

Office Action (Application No. 200610107648.4) Dated Feb. 6, 2009.

*Primary Examiner* — Daniel Whalen
(74) *Attorney, Agent, or Firm* — Robinson Intellectual Property Law Office; Eric J. Robinson

(57) ABSTRACT

It is an object of the present invention to provide a semiconductor device where, even in a case of stacking a plurality of semiconductor elements provided over a substrate, the stacked semiconductor elements can be electrically connected through the substrate, and a manufacturing method thereof. According to one feature of the present invention, a method for manufacturing a semiconductor device includes the steps of selectively forming a depression in an upper surface of a substrate or forming an opening which penetrates the upper surface through a back surface; forming an element group having a transistor so as to cover the upper surface of the substrate and the depression, or the opening; and exposing the element group formed in the depression or the opening by thinning the substrate from the back surface. A means for thinning the substrate can be performed by partially removing the substrate by performing grinding treatment, polishing treatment, etching by chemical treatment, or the like from the back surface of the substrate.

17 Claims, 21 Drawing Sheets

(51) Int. Cl.
*H01L 27/13* (2006.01)
*H01L 21/304* (2006.01)
*H01L 29/78* (2006.01)
*H01L 29/786* (2006.01)

(52) U.S. Cl.
CPC ........... *H01L27/1266* (2013.01); *H01L 27/13* (2013.01); *H01L 29/78* (2013.01); *H01L 29/78603* (2013.01); *H01L 2924/0002* (2013.01)

(56) References Cited

U.S. PATENT DOCUMENTS

| | | | |
|---|---|---|---|
| 6,011,607 A | 1/2000 | Yamazaki et al. | |
| 6,022,792 A | 2/2000 | Ishii et al. | |
| 6,235,624 B1 | 5/2001 | Sasaki et al. | |
| 6,355,942 B1 | 3/2002 | Yamazaki et al. | |
| 6,646,711 B2 | 11/2003 | Sugano | |
| 6,682,963 B2 | 1/2004 | Ishikawa | |
| 6,703,643 B2 | 3/2004 | Yamazaki et al. | |
| 6,707,157 B2 | 3/2004 | Hoshino | |
| 6,800,557 B2 | 10/2004 | Ohashi et al. | |
| 6,809,421 B1 * | 10/2004 | Hayasaka | H01L 21/76898 257/621 |
| 7,005,324 B2 | 2/2006 | Imai | |
| 7,105,422 B2 | 9/2006 | Utsunomiya | |
| 7,109,071 B2 | 9/2006 | Ishikawa | |
| 7,122,445 B2 | 10/2006 | Takayama et al. | |
| 7,125,810 B2 | 10/2006 | Muta et al. | |
| 7,338,896 B2 | 3/2008 | Vanhaelemeersch et al. | |
| 7,368,318 B2 | 5/2008 | Yamazaki | |
| 7,402,903 B2 | 7/2008 | Matsuo | |
| 7,405,432 B2 | 7/2008 | Adachi | |
| 7,422,935 B2 | 9/2008 | Yamazaki | |
| 7,436,050 B2 | 10/2008 | Yamazaki et al. | |
| 7,446,336 B2 | 11/2008 | Yamazaki et al. | |
| 7,485,511 B2 | 2/2009 | Yamada et al. | |
| 7,538,849 B2 | 5/2009 | Yamazaki et al. | |
| 7,598,100 B2 | 10/2009 | Matsumoto et al. | |
| 7,736,964 B2 | 6/2010 | Yamamoto et al. | |
| 7,772,684 B2 | 8/2010 | Kuramochi et al. | |
| 7,863,188 B2 | 1/2011 | Tsurume et al. | |
| 7,924,392 B2 | 4/2011 | Yamazaki et al. | |
| 8,557,699 B2 | 10/2013 | Tsurume et al. | |
| 2004/0262767 A1 * | 12/2004 | Matsuo | H01L 21/76898 257/758 |
| 2005/0006647 A1 | 1/2005 | Utsunomiya | |
| 2005/0082534 A1 | 4/2005 | Kim et al. | |
| 2005/0116310 A1 * | 6/2005 | Nishi | H01L 27/1446 257/440 |
| 2006/0290001 A1 | 12/2006 | Sulfridge | |
| 2007/0052088 A1 | 3/2007 | Tsurume et al. | |

FOREIGN PATENT DOCUMENTS

| | | |
|---|---|---|
| JP | 2001-339057 A | 12/2001 |
| JP | 2002-087844 A | 3/2002 |
| JP | 2002-261192 A | 9/2002 |
| JP | 2003-017558 A | 1/2003 |
| JP | 2004-349513 A | 12/2004 |
| JP | 2005-093954 A | 4/2005 |

* cited by examiner 101 102

103

104

106

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. In particular, the present invention relates to a semiconductor device where a semiconductor element provided over an upper surface of a substrate can be electrically connected to a back surface of the substrate with the substrate interposed therebetween, and a preferable manufacturing method thereof.

2. Description of the Related Art

In recent years, by forming a semiconductor element over a rigid substrate such as a glass substrate, a semiconductor device has been actively developed for use in a display such as an LCD or an organic EL display, a photoelectric conversion element such as a photo sensor or a solar cell, or the like. In addition, by forming a semiconductor element using a Si wafer, a semiconductor device for use in a cellular phone and the like has been developed. Moreover, a semiconductor device which transmits and receives data without contact (also referred to as an RFID (Radio Frequency Identification) tag, an ID tag, an IC tag, an IC chip, an RF (Radio Frequency) tag, a wireless tag, an electronic tag, or a wireless chip) has been actively developed. In any case of using a rigid substrate such as a glass substrate, a semiconductor substrate such as a Si substrate, and the like for manufacturing such a semiconductor device, reduction in thickness, miniaturization, or the like of the semiconductor device is required.

As a method for thinning a semiconductor device, for example, a method for grinding and polishing a substrate, a method for etching a substrate by using a chemical reaction, or the like (for example, see Reference 1: Japanese Patent Application Laid-Open No. 2002-87844) is performed.

However, generally, in a case of forming a thin substrate with the use of the above method, an upper surface of a substrate is provided with a semiconductor element, but a method for forming electrical continuity between the semiconductor element that is provided over an upper surface of a substrate and a back surface thereof has not been established yet. Therefore, although thin semiconductor elements can be stacked, a lead wiring and the like are necessary in a case of electrically connecting the stacked semiconductor elements; thus, it has been difficult to further increase an added value thereof.

SUMMARY OF THE INVENTION

In view of the above problem, it is an object of the present invention to provide a semiconductor device where, even in a case of stacking a plurality of semiconductor elements provided over a substrate, the stacked semiconductor elements can be electrically connected through the substrate, and a manufacturing method thereof.

According to one feature of the present invention, a method for manufacturing a semiconductor device includes the steps of selectively forming a depression in an upper surface of a substrate or forming an opening which penetrates the upper surface through a back surface; forming an element group having a transistor so as to cover the upper surface of the substrate and the depression, or the opening; and exposing the element group formed in the depression or the opening by thinning the substrate from the back surface. A means for thinning the substrate can be performed by partially removing the substrate by performing grinding treatment, polishing treatment, etching by chemical treatment, or the like from the back surface of the substrate. Note that these means for thinning the substrate can also be combined. For example, after performing grinding treatment from the back surface of the substrate, subsequently, polishing treatment is performed from the back surface of the substrate.

In addition, according to another feature of the present invention, a method for manufacturing a semiconductor device includes the steps of forming an insulating film serving as a base film over a substrate, where an upper surface is selectively provided with a depression, so as to cover the upper surface and the depression; forming a semiconductor film over the insulating film; forming a gate electrode over the semiconductor film with a gate insulating film interposed therebetween; forming an impurity region serving as a source or drain region in the semiconductor film; forming a first interlayer insulating film so as to cover the semiconductor film and the gate electrode; forming a first opening which reaches the impurity region of the semiconductor film by selectively etching the first interlayer insulating film; forming a second opening by removing the first interlayer insulating film provided over the depression; selectively forming a conductive film in the first and second openings; forming a second interlayer insulating film so as to cover the first interlayer insulating film and the conductive film; and exposing the conductive film provided in the second opening by thinning the substrate from a back surface. Additionally, in the above structure, a substrate having an opening that penetrates an upper surface through a back surface may also be used instead of the substrate where the upper surface is provided with the depression.

Moreover, according to another feature of the present invention, in the above structures of a method for manufacturing a semiconductor device, the second opening is formed to be larger than the first opening. Note that an opening being large refers to a long depth of an opening or a width (area) of an opening in a perpendicular direction with respect to a depth direction is long. In addition, in the above structures, each conductive film formed in the first opening and the second opening may be formed from a different material by a different method. For example, after selectively forming a conductive film for the first opening by a CVD method, a sputtering method, or the like, another conductive film may also be selectively formed in the second opening by a screen printing method, a droplet discharging method, a dispenser method, or the like.

Further, according to another feature of the present invention, a method for manufacturing a semiconductor device includes the steps of forming an insulating film serving as a base film over a substrate, where a first opening which penetrates an upper surface through a back surface is provided, so as to cover the upper surface and the first opening; forming a semiconductor film over the insulating film; forming a gate electrode over the semiconductor film with a gate insulating film interposed therebetween; forming an impurity region serving as a source or drain region in the semiconductor film; forming a first interlayer insulating film so as to cover the semiconductor film and the gate electrode; forming a second opening which reaches the impurity region of the semiconductor film by selectively etching the first interlayer insulating film; forming a third opening by removing the first interlayer insulating film provided over the first opening; selectively forming a conductive film in the second opening and the third opening; forming a second interlayer insulating film so as to cover the first interlayer insulating film and the conductive film; and exposing the conductive film provided in the third opening by thinning the substrate from the back surface.

Still further, according to another feature of the present invention, a method for manufacturing a semiconductor device comprises the steps of forming an insulating film serving as a base film over a substrate, where a first opening which penetrates an upper surface through a back surface is provided, so as to cover the upper surface and the first opening; forming a semiconductor film over the insulating film; forming a gate electrode over the semiconductor film with a gate insulating film interposed therebetween; forming an impurity region serving as a source or drain region in the semiconductor film; forming a first interlayer insulating film so as to cover the semiconductor film and the gate electrode; forming a second opening which reaches the impurity region of the semiconductor film by selectively etching the first interlayer insulating film; selectively forming a first conductive film in the second opening; forming a third opening by removing the first interlayer insulating film provided over the first opening; selectively forming a second conductive film in the third opening; forming a second interlayer insulating film so as to cover the first interlayer insulating film, the first conductive film, and the second conductive film; and exposing the second conductive film provided in the third opening by thinning the substrate from the back surface.

According to one feature of the present invention, a semiconductor device includes a substrate having an opening provided to penetrate an upper surface through a back surface; and an element group provided over the upper surface of the substrate and in the opening, where at least part of the element group provided in the opening is exposed in the back surface of the substrate, and where a thickness of the substrate is 1 μm to 100 μm.

According to another feature of the present invention, a semiconductor device includes a substrate having an opening provided to penetrate an upper surface through a back surface; a transistor provided over the upper surface of the substrate; and a conductive film provided in the opening, where the transistor and the conductive film are electrically connected, where at least part of the conductive film provided in the opening is exposed in the back surface of the substrate, and where a thickness of the substrate is 1 μm to 100 μm.

According to the present invention, in a back surface of a substrate in which a semiconductor element is provided over an upper surface, electrical connection to the semiconductor element can be obtained through the substrate; therefore, freedom in a layout of the semiconductor element is improved. In addition, it is possible to accomplish miniaturization and high performance of a semiconductor device by stacking semiconductor elements in a multilayer to be connected.

BRIEF DESCRIPTION OF THE DRAWINGS

In the accompanying drawings.

DETAILED DESCRIPTION OF THE INVENTION

Figure 1A:
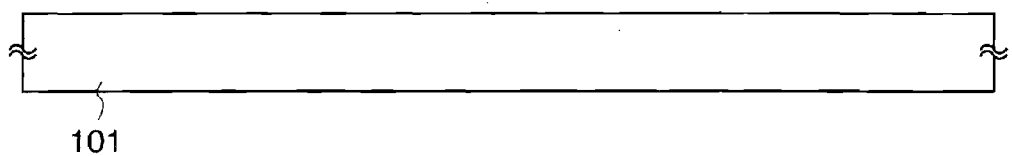
FIGS. 1A to 1E are views each showing one example of a manufacturing method of a semiconductor device according to the present invention.

Embodiment modes of the present invention will be explained hereinafter with reference to the accompanying drawings. However, it is to be easily understood that various changes and modifications will be apparent to those skilled in the art. Therefore, unless such changes and modifications depart from the purport and the scope of the present invention, they should be construed as being included therein. Note that, in the structure of the present invention hereinafter explained, reference numerals denoting the identical portions are used in common in different drawings and explanations thereof are omitted in some cases.

As one example of a semiconductor device of the present invention, a structure where a semiconductor element provided over an upper (first) surface (hereinafter, also referred to as an "upper surface") of a substrate can be electrically connected to a back (second) surface (hereinafter, also referred to as a "back surface") of the substrate with the substrate interposed therebetween can be given. Specifically, over the upper surface of the substrate having an opening provided to penetrate an upper surface through a back surface, a semiconductor element such as a transistor is provided; therefore, the semiconductor element and the back surface of the substrate can be electrically connected through the opening.

Hereinafter, one example of a manufacturing method of a semiconductor device according to the present invention will be explained with reference to drawings (FIGS. 1A to 1E and FIGS. 2A to 2D). Note that FIGS. 2A to 2D correspond to perspective views of FIGS. 1A to 1E, respectively.

First, a substrate 101 is prepared, the upper surface of which is washed using hydrofluoric acid (HF), alkali, or purified water (FIG. 1A).

As the substrate 101, a glass substrate, a quartz substrate, a ceramic substrate, a metal substrate including a stainless-steel, or the like can be used. In addition, a semiconductor substrate such as a Si substrate may also be used. Besides, it is also possible to use a substrate made of a flexible synthetic resin such as plastic typified by polyethylene terephthalate (PET), polyethylene naphthalate (PEN), or polyether sulfone (PES), or acrylic. Moreover, in a case of using such a substrate, since there is no strict limit on the size and shape of the substrate, the productivity can be improved largely as long as a rectangular substrate whose side is 1 m or more is used, for example. As compared with a case of using a circular silicon substrate, such a merit is highly advantageous. Note that the upper surface of the substrate may also be planarized in advance by performing polishing treatment.

Figure 1B:
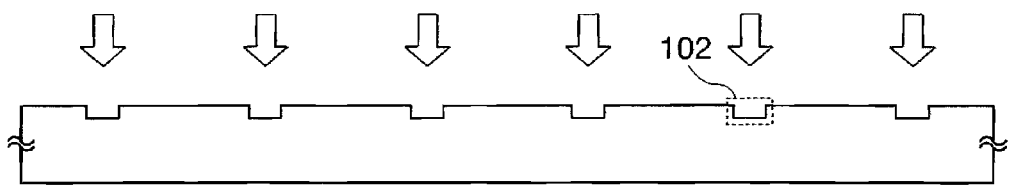
Figure 2A:
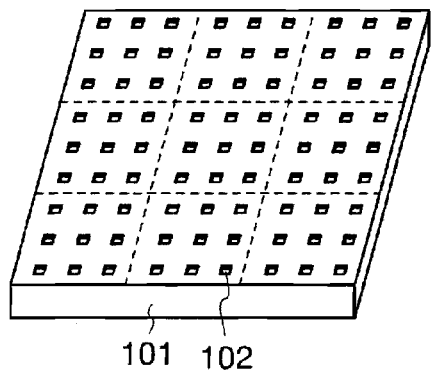
FIGS. 2A to 2D are views each showing one example of a manufacturing method of a semiconductor device according to the present invention.

Next, a depression 102 is formed in an upper surface of the substrate 101. The depression 102 can be selectively formed by performing etching, laser light irradiation, or the like to the substrate 101 (FIG. 1B and FIG. 2A). Note that, instead of forming the depression in the upper surface of the substrate 101, an opening that penetrates the upper surface through a back surface of the substrate 101 may be formed.

The depression 102 (in a case of forming an opening, the shape of the opening) may be formed into any shape, and the depression 102 can be formed into a linear shape, a circular shape, a rectangular shape, or the like, for example. As the dimension of the depression 102 (in a case of forming an opening, the dimension of the opening), it is preferable that the depression 102 be formed so that a depth thereof is 1 to 100 µm, preferably, 2 to 50 µm, and a width thereof is 10 µm to 10 mm, preferably, 100 µm to 1 mm. Note that the depression or an opening that is formed in the substrate may be formed to have a tapered shape in a depth direction.

Figure 1C:
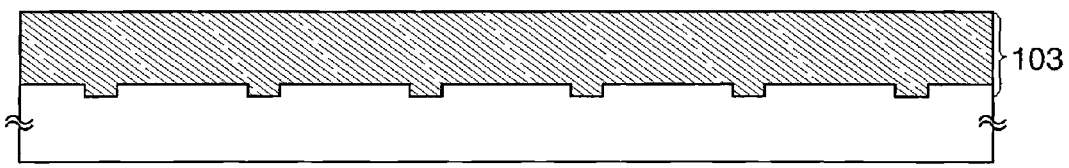
Figure 2B:
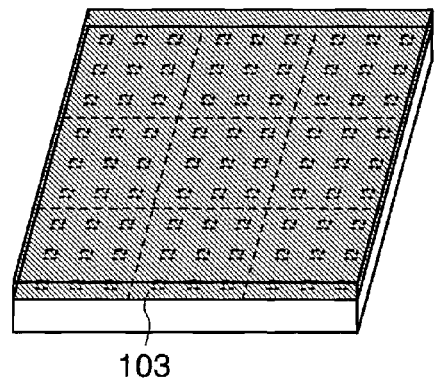

Then, an element group 103 is formed over the upper surface of the substrate 101 (FIG. 1C and FIG. 2B). Note that the element group 103 is provided so that the depression 102 formed in the substrate 101 is at least filled with part of the element group 103.

The element group 103 includes a semiconductor element such as a transistor or a diode, for example. As the transistor, a thin film transistor (TFT) where a semiconductor film, which is formed over a rigid substrate such as glass, is used as a channel, a field effect transistor (FET) over a semiconductor substrate such as a Si substrate, where the substrate is used as a channel, an organic TFT where an organic material is used as a channel, or the like can be provided. In addition, as the diode, various diodes such as a variable capacitance diode, a Schottky diode, and a tunnel diode can be applied. In the present invention, by using these transistors, diodes, or the like, any sort of integrated circuits including a CPU, a memory, a microprocessor, various sensors such as a temperature sensor; a humidity sensor; and a biosensor, and the like can be provided. Moreover, as for the element group 103, the present invention includes a mode having an antenna in addition to the semiconductor element such as a transistor. A semiconductor device where the element group 103 is provided with an antenna can be operated by using an AC voltage that is generated in the antenna and data can be transmitted and received without contact with an external equipment (a reader/writer) by modulating an AC voltage that is applied to the antenna. Note that the antenna may be formed along with an integrated circuit having a transistor or may be electrically connected to an integrated circuit after being formed separately from the integrated circuit.

In a case of providing a transistor as the element group 103, it is preferable to form a transistor over the upper surface of the substrate 101 (a portion other than the depression 102) and a conductive film electrically connected to the transistor is formed in the depression 102.

Figure 1D:
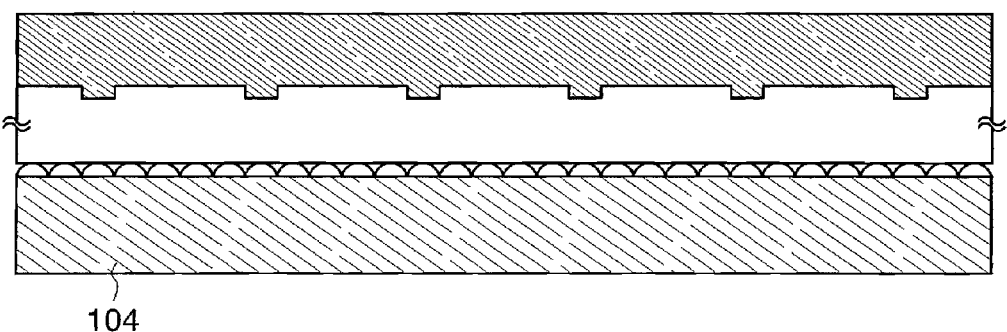
Figure 2C:
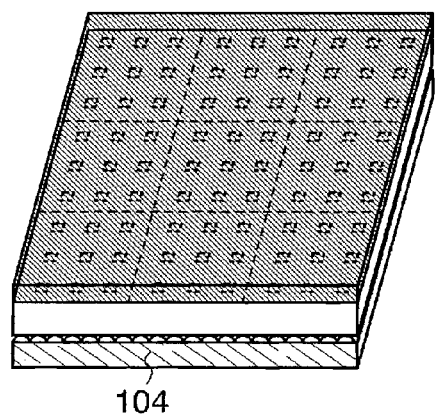

Next, the substrate 101 is thinned by a means 104 for thinning a film (FIG. 1D and FIG. 2C). Here, the substrate 101 is thinned by thinning the substrate 101 from a back surface thereof by the means 104 for thinning a film until the element group 103 provided in the depression 102 is exposed.

As the means 104 for thinning a film, grinding treatment, polishing treatment, etching by chemical treatment, or the like can be used. As for grinding treatment, an upper surface of an object to be treated (here, a back surface of the substrate 101) is ground and smoothed using grains of a grinding stone. As for polishing treatment, the upper surface of the object to be treated is smoothed by a plastic smoothing action or frictional polishing action using an abrasive agent such as abrasive-coated cloth and paper or abrasive grains. As for chemical treatment, chemical etching is performed using an agent to the object to be treated. Note that, as the polishing treatment, CMP (Chemical Mechanical Polishing) may also be used.

For example, grinding treatment is performed to the back surface of the substrate 101 and thereafter polishing treatment is performed to the back surface of the substrate 101; therefore, the substrate 101 can be thinned. In addition, after performing one or both of grinding treatment and polishing treatment, the substrate may be thinned or removed by further performing etching with the use of chemical treatment. In a case of using a glass substrate as the substrate 101, chemical etching using a chemical solution containing hydrofluoric acid can be performed as chemical treatment. Note that, in the case of thinning the substrate 101, the substrate that remains after being thinned preferably has a thickness of 100 µm or less, preferably 50 µm or less, much preferably 30 µm or less, so that a semiconductor device to be obtained has flexibility. In addition, the substrate that remains after being thinned serves as a protective film that keeps resistance of a semiconductor device and prevents an impurity element, moisture, or the like from the outside from entering a semiconductor element. Therefore, the substrate is preferably thinned to have a thickness of 1 µm or more, preferably, 2 µm or more, and much preferably, 4 µm or more.

In addition, in a case of thinning the substrate 101 by performing grinding treatment, polishing treatment, or etching with the use of chemical treatment, when the element group 103 provided in an opening has a high selective ratio to the substrate 101, the element group 103 can be used as a stopper. For example, in a case of providing a conductive film, which is part of the element group 103, in the depression 102 that is formed in the substrate 101, the conductive film can be used as a stopper in thinning the substrate 101 by providing the conductive film using a substance having high physical intensity and chemical intensity, compared with the substrate 101.

Figure 1E:
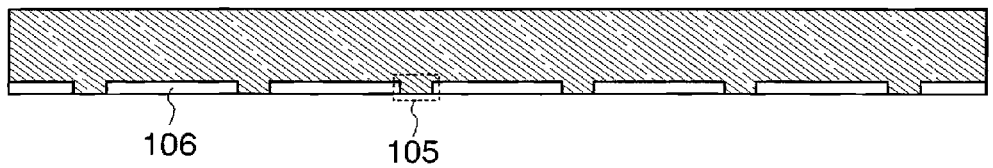
Figure 2D:
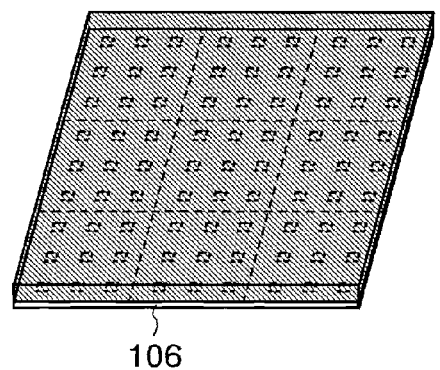

Through the above steps, a semiconductor device of the present invention can be manufactured (FIG. 1E and FIG. 2D). Note that a semiconductor device shown in FIG. 1E is provided with a substrate 106 that is obtained by thinning the substrate 101 and the element group 103 that is formed over an upper surface of the substrate 106. In addition, the substrate 106 is provided with an opening 105 which penetrates through the substrate 106 and the opening 105 is filled with part of the element group 103. Therefore, part of the element group 103 is exposed in a back surface of the substrate 106. Accordingly, in a semiconductor device shown in the present invention, the back surface of the substrate 106 can be electrically connected to the element group 103 with the substrate interposed therebetween.

Embodiment Mode 1

This embodiment mode will explain more specifically one example of a manufacturing method of a semiconductor device of the present invention with reference to drawings.

Figure 3A:
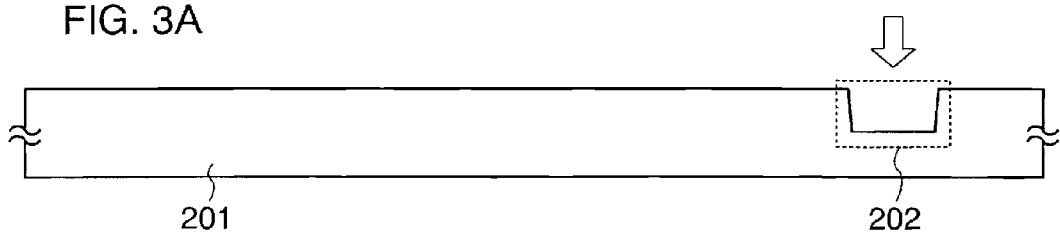
FIGS. 3A to 3E are views each showing one example of a manufacturing method of a semiconductor device according to the present invention.

First, a depression 202 is selectively formed by performing etching, laser light irradiation, or the like from an upper surface of a substrate 201 (FIG. 3A). Note that, instead of forming the depression in the upper surface of the substrate 201, an opening that penetrates the upper surface through a back surface of the substrate 201 may also be formed. The depression 202 (in a case of forming an opening, the shape of the opening) may be formed into any shape, and the depression 202 can be formed into a linear shape, a circular shape, a rectangular shape, or the like, for example. Preferably, as the dimension of the depression 202 (in a case of forming an opening, the dimension of the opening), the depression 202 is formed so that a depth thereof is 1 to 100 µm, preferably, 2 to 50 µm, and a width thereof is 10 µm to 10 mm, preferably, 100 µm to 1 mm. Note that the depression or the opening that is formed in the substrate may be formed to have a tapered shape in a depth direction.

Figure 3B:
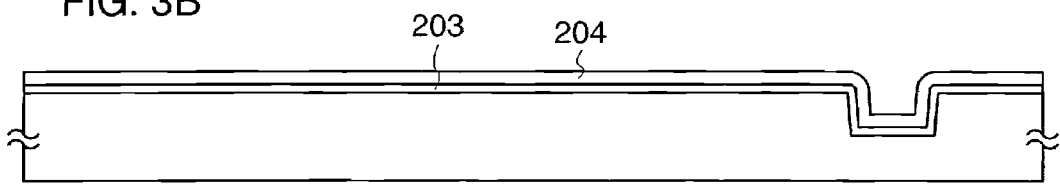

Next, an insulating film 203 serving as a base film is formed over the substrate 201, and a semiconductor film 204 is formed over the insulating film 203 (FIG. 3B). Note that the insulating film 203 and the semiconductor film 204 are also formed in the depression 202.

The insulating film 203 can be provided with a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film; or a stacked structure thereof. For example, in a case where the insulating film 203 has a two-layer structure, it is preferable to provide a silicon nitride oxide film as a first layer of the insulating film and a silicon oxynitride film as a second layer of the insulating film. In a case where the insulating film 203 has a three-layer structure, it is preferable to provide a silicon oxynitride film as a first layer of the insulating film, a silicon nitride oxide film as a second layer of the insulating film, and a silicon oxynitride film as a third layer of the insulating film. Thus, forming the insulating film 203 serving as a base film can suppress the diffusion of alkali metal such as Na or alkaline earth metal into the semiconductor film 204 from the substrate 201 and the adverse effect thereof on characteristics of a semiconductor element.

The semiconductor film 204 can be formed with an amorphous semiconductor or a semi-amorphous semiconductor (SAS). Alternatively, a polycrystalline semiconductor film may be used. The SAS has an intermediate structure between an amorphous structure and a crystalline structure (including a single crystal and a polycrystal) and a third state which is stable in terms of free energy, and the SAS includes a crystalline region having short-range order and lattice distortion. In at least part of a region of the film, a crystal region of 0.5 to 20 nm can be observed. In a case of containing silicon as a main component, a Raman spectrum is shifted to a lower wavenumber side than 520 $cm^{-1}$. A diffraction peak of (111) or (220) to be caused by a crystal lattice of silicon is observed in X-ray diffraction. Hydrogen or halogen of at least 1 atomic % or more is contained to terminate dangling bonds. The SAS is formed by performing glow discharge decomposition (plasma CVD) to a gas containing silicon. $SiH_4$ is given as the gas containing silicon. In addition, $Si_2H_6$, $SiH_2Cl_2$, $SiHCl_3$, $SiCl_4$, $SiF_4$, or the like can also be used as the gas containing silicon. In addition, $GeF_4$ may also be mixed. The gas containing silicon may be diluted with $H_2$, or $H_2$ and one or more rare gas elements of He, Ar, Kr, and Ne. A dilution ratio thereof may range from 2 to 1000 times; a pressure, approximately 0.1 to 133 Pa; and a power supply frequency, 1 to 120 MHz, preferably, 13 to 60 MHz. Substrate heating temperatures may be 300° C. or less. A concentration of an atmospheric constituent impurity such as oxygen, nitrogen, or carbon, as an impurity element in the film, is preferably $1 \times 10^{20}$ atoms/$cm^3$ or less; in particular, a concentration of oxygen is $5 \times 10^{19}$ atoms/$cm^3$ or less, preferably $1 \times 10^{19}$ atoms/$cm^3$ or less. Here, an amorphous semiconductor film is formed with a material containing silicon (Si) as its main component (such as $Si_XGe_{1-X}$) using a sputtering method, a CVD method, or the like, and the amorphous semiconductor film is crystallized by a laser crystallization method, a thermal crystallization method using RTA or an annealing furnace, a thermal crystallization method using a metal element which promotes crystallization, or the like. In addition, the crystallization of the semiconductor film can also be performed by generating thermal plasma by application of a DC bias and applying the thermal plasma to the semiconductor film.

Figure 3C:
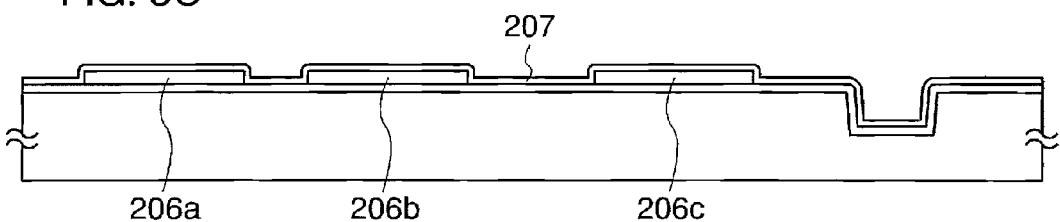

Then, the semiconductor film 204 is selectively etched to form island-shaped semiconductor films 206a to 206c, and a gate insulating film 207 is formed so as to cover the island-shaped semiconductor films 206a to 206c (FIG. 3C).

The gate insulating film 207 can be provided by a CVD method, a sputtering method, or the like to have a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film; or a stacked structure thereof. Alternatively, the gate insulating film can also be formed by performing oxidation treatment or nitriding treatment to the surface of the island-shaped semiconductor films 206a to 206c by performing high-density plasma treatment to the island-shaped semiconductor films 206a to 206c under an oxygen atmosphere (for example, an atmosphere containing oxygen ($O_2$) and a rare gas (including at least one of He, Ne, Ar, Kr, and Xe) or an atmosphere containing oxygen, hydrogen ($H_2$), and a rare gas) or a nitrogen atmosphere (for example, an atmosphere containing nitrogen ($N_2$) and a rare gas (including at least one of He, Ne, Ar, Kr, and Xe), an atmosphere containing nitrogen, hydrogen, and a rare gas, or an atmosphere containing $NH_3$ and a rare gas). The gate insulating film formed with an oxidation treatment layer or a nitriding treatment layer formed by performing oxidation treatment or nitriding treatment to the island-shaped semiconductor films 206a to 206c by high-density plasma treatment is superior in uniformity of thickness or the like to an insulating film formed by a CVD method, a sputtering method, or the like and has a dense film.

Figure 3D:
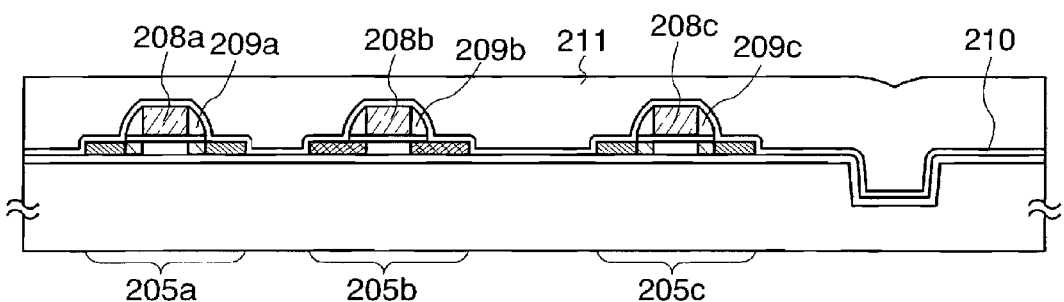

Next, thin film transistors 205a to 205c are provided by selectively forming gate electrodes 208a to 208c over the gate insulating film 207 and thereafter forming an insulating film 210 and an insulating film 211 to cover the gate electrodes 208a to 208c (FIG. 3D). Note that, in the thin film transistors 205a to 205c, each part of the semiconductor films 206a to 206c is used as a channel region, and sidewalls 209a to 209c (hereinafter, also referred to as insulating films 209a to 209c) are provided to be in contact with side faces of the gate electrodes 208a to 208c, respectively. In addition, in the n-channel thin film transistors 205a and 205c, an LDD region is provided in each of the semiconductor films 206a and 206c located below the insulating films 209a and 209c. Specifically, an LDD region is formed between a source or drain region and a channel region.

The gate electrodes 208a to 208c can be provided by a CVD method, a sputtering method, or the like with a single-layer structure of an element of tantalum (Ta), tungsten (W), titanium (Ti), molybdenum (Mo), aluminum (Al), copper (Cu), chromium (Cr), niobium (Nb), and the like, or an alloy material or a compound material containing the element as its main component; or a stacked structure thereof. Alternatively, the gate electrodes 208a to 208c can also be formed with a semiconductor material typified by polycrystalline silicon which is doped with an impurity element such as phosphorus. For example, the gate electrodes can be provided with a stacked structure of tantalum nitride and tungsten.

The insulating films 209a to 209c can be provided by a CVD method, a sputtering method, or the like to have a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film, or a film containing carbon such as a DLC (diamond like carbon) film; or a stacked structure thereof.

The insulating film 210 can be provided by a CVD method, a sputtering method, or the like with a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film, or a film containing carbon such as a DLC (diamond like carbon) film; or a stacked structure thereof.

The insulating film 211 can be provided by a CVD method, a sputtering method, or the like with a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film, a film containing carbon such as a DLC (diamond like carbon) film, an organic material such as epoxy, polyimide, polyamide, polyvinyl phenol, benzocyclobutene, or acrylic, or a siloxane material such as siloxane resin; or a stacked structure thereof. Note that the siloxane material corresponds to a material having Si—O—Si bonds. Siloxane has a skeleton formed of a bond of silicon (Si) and oxygen (O). As a substituent, an organic group containing at least hydrogen (for example, an alkyl group or aromatic hydrocarbon) is used. As a substituent, a fluoro group can also be used. Alternatively, an organic group containing at least hydrogen and a fluoro group may be used as a substituent. Note that, in the semiconductor device in FIGS. 3A to 3E, the insulating film 211 can be provided directly to cover the gate electrodes 208a to 208c without providing the insulating film 210.

Figure 3E:
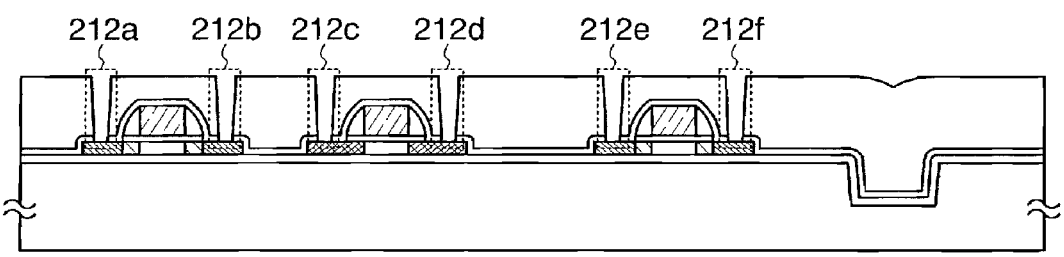

Then, by selectively removing the insulating film 211, the insulating film 210, and the like, openings 212a to 212f each reaching part of the semiconductor films 206a to 206c, which are to be source or drain regions of the thin film transistors 205a to 205c, are formed (FIG. 3E).

Figure 4A:
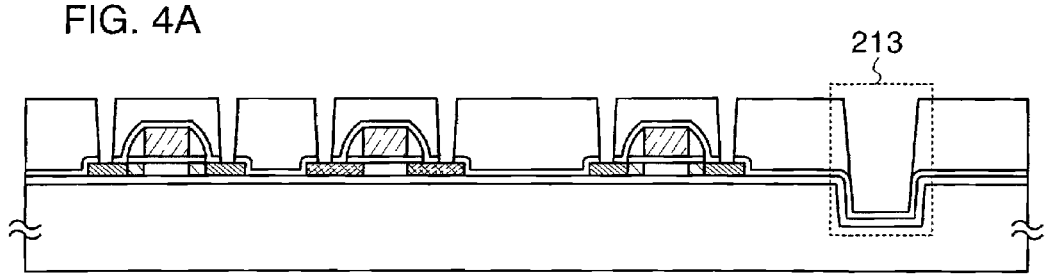
FIGS. 4A to 4D are views each showing one example of a manufacturing method of a semiconductor device according to the present invention.

Next, by selectively removing the insulating film 211 and the like that are formed over the depression 202, an opening 213 is formed so as to form the depression in the surface of the substrate 201 (FIG. 4A). Note that the opening 213 is preferably formed so as to form at least the depression in the upper surface of the substrate 201, and part of the insulating film 211 may be selectively removed or the insulating film 211, the insulating film 210, and the insulating film 203 may be selectively removed. In addition, although an example of forming the opening 213 after forming the openings 212a to 212f is shown here, the opening 213 may be formed concurrently with the openings 212a to 212f, or the openings 212a to 212f can be formed after forming the opening 213. Moreover, the opening 213 can also be formed after forming the openings 212a to 212f and selectively forming a conductive film in the openings 212a to 212f. As for a method for forming the openings 212a to 212f or the opening 213, etching using a photolithography step or laser light irradiation may be employed.

Figure 4B:
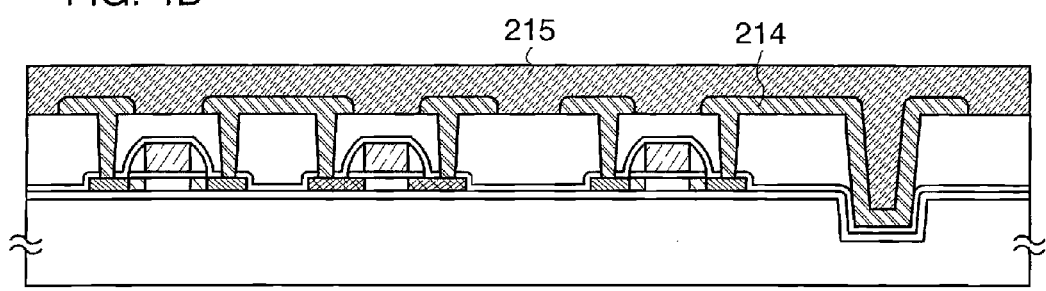

Then, a conductive film 214 is selectively formed in the openings 212a to 212f and the opening 213, and an insulating film 215 serving as a protective film is formed so as to cover the conductive film 214 (FIG. 4B).

The conductive film 214 can be formed by a CVD method, a sputtering method, a screen printing method, a droplet discharging method, a dispenser method, or the like with a single-layer structure of an element of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), and carbon (C), or an alloy containing a plurality of the elements; or a stacked structure thereof. For a conductive film formed of an alloy containing a plurality of the elements, an Al alloy containing C and Ti, an Al alloy containing Ni, an Al alloy containing C and Ni, an Al alloy containing C and Mn, or the like can be used, for example. In addition, in a case of providing with a stacked structure, the conductive film can be provided with a stacked layer where Al is sandwiched between Ti (a stacked layer of Ti, Al, and Ti).

Figure 5A:
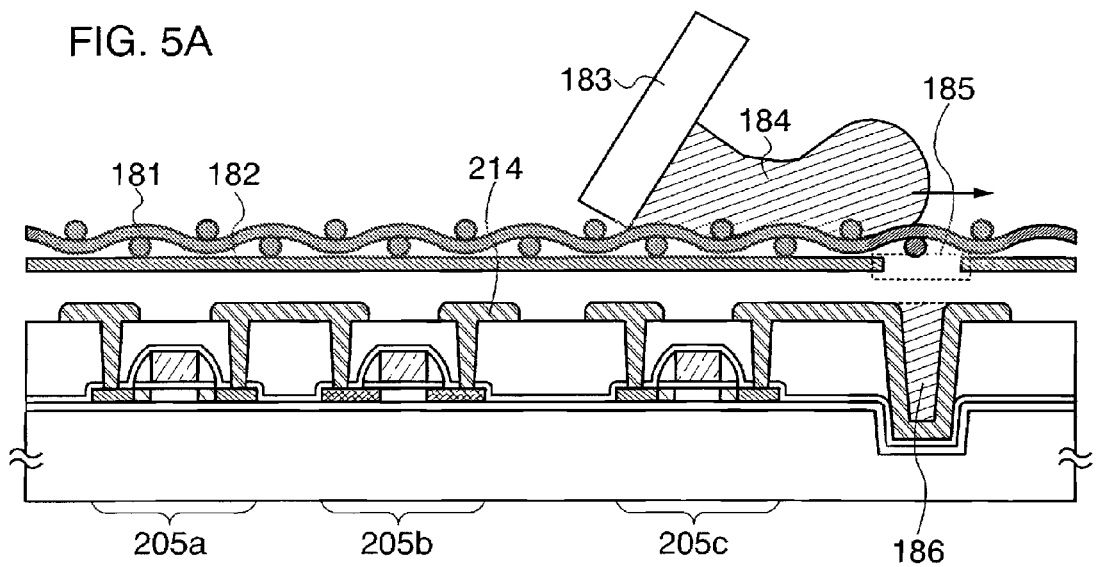
FIGS. 5A and 5B are views each showing one example of a manufacturing method of a semiconductor device according to the present invention.
Figure 5B:
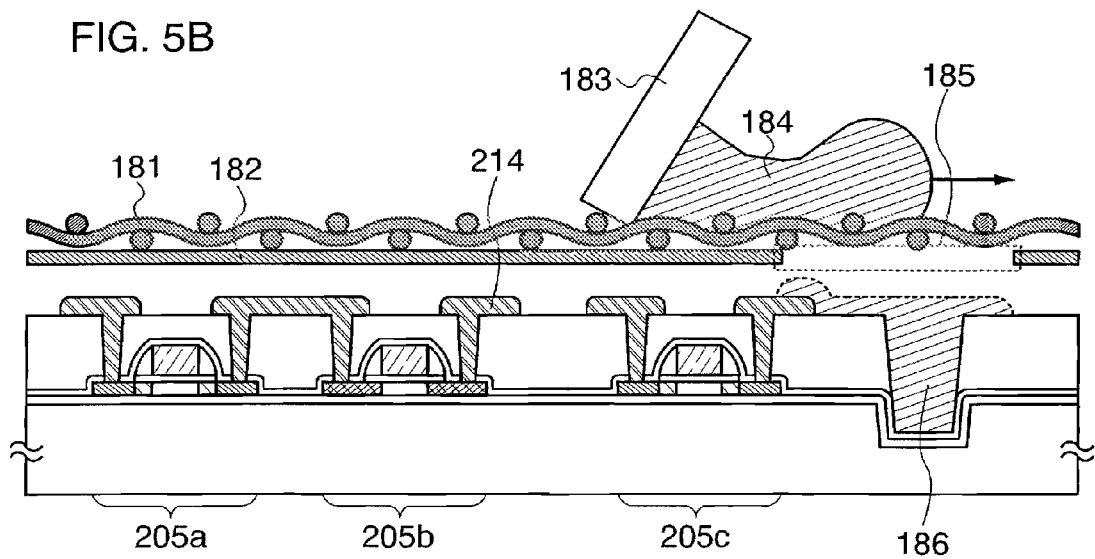

In addition, when the opening 213 is large or when it is concerned that defective connection such as disconnection occurs in the conductive film 214 provided in the opening 213, it is preferable to selectively provide again the opening 213 with a conductive material after providing the conductive film 214 in the opening 213. For example, after selectively forming the conductive film 214 in the openings 212a to 212f and the opening 213 by a CVD method, a sputtering method, or the like, a conductive material 186 is provided over the conductive film 214 provided in the opening 213 by a screen printing method, a droplet discharging method, a dispenser method, or the like. Here, with the use of a screen printing method, the conductive material 186 is formed in the opening 213 by pushing a paste 184 out of an opening 185 provided in an emulsion 182, while pushing and moving the paste 184 over a mesh 181 by a squeegee 183, as shown in FIG. 5A. Besides, after providing the conductive film 214 in the openings 212a to 212f by a CVD method or a sputtering method, the conductive material 186 may be selectively provided in the opening 213 by a screen printing method, a droplet discharging method, a dispenser method, or the like (FIG. 5B). By selectively forming the conductive material in the opening 213 by a screen printing method, a droplet discharging method, a dispenser method, or the like, it is possible to prevent disconnection and the like of the conductive film in the opening 213 and to fill the conductive material to the bottom of the opening 213.

The insulating film 215 can be provided by a CVD method, a sputtering method, or the like with a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film, a film containing carbon such as a DLC (diamond like carbon) film, an organic material such as epoxy, polyimide, polyamide, polyvinyl phenol, benzocyclobutene, or acrylic, or a siloxane material such as siloxane resin; or a stacked structure thereof.

Figure 4C:
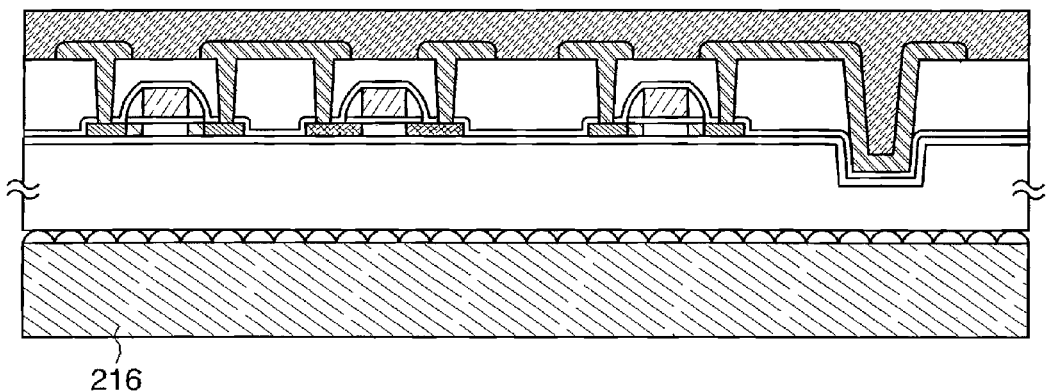

Next, the substrate 201 is thinned by performing grinding treatment, polishing treatment, etching by chemical treatment, or the like to a back surface of the substrate 201 (a surface opposite to the upper surface provided with the insulating film 203) (FIG. 4C). Here, an example of grinding the back surface of the substrate 201 by using a grinding means 216 is shown. In addition, by further subjecting the upper surface of the substrate 201 to polishing treatment after grinding treatment, the shape of the back surface of the substrate 201 can be uniformed. Moreover, the substrate may be thinned by performing etching using chemical treatment after performing grinding treatment and polishing treatment.

Figure 4D:
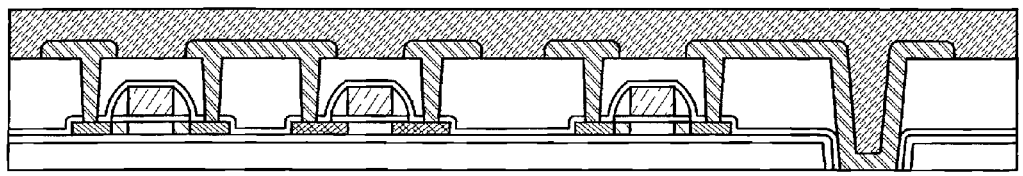

The substrate 201 is thinned until one or both the conductive film 214 and the conductive material 186 provided in the opening 213 are exposed (FIG. 4D). Therefore, in a case where there are the insulating film 210, the insulating film 203, and the like below the conductive film 214 in the opening 213, the insulating film 210 and the insulating film 203 are removed by grinding treatment, polishing treatment, etching by chemical treatment, or the like, concurrently with thinning the substrate 201. In addition, in a case of using a glass substrate as the substrate 201, chemical etching using a chemical solution containing hydrofluoric acid can be performed as chemical treatment. Note that, in the case of thinning the substrate 201, the substrate preferably has a thickness of 100 μm or less, preferably 50 μm or less, much preferably 30 μm or less, so that a semiconductor device to be obtained has flexibility. Moreover, the substrate 201 serves as a protective film that keeps resistance of a semiconductor device and prevents an impurity element, moisture, or the like from the outside from entering a semiconductor element. Therefore, the substrate is preferably thinned to have a thickness of 1 μm or more, preferably, 2 μm or more, and much preferably, 4 μm or more.

Through the above steps, it is possible to obtain a semiconductor device where a thin film transistor can be electrically connected in a back surface of a substrate opposite to the upper surface provided with the thin film transistor.

Note that an example of forming a thin film transistor over a substrate is shown in the above FIGS. 3A to 3E and FIGS. 4A to 4D. However, besides a thin film transistor, a field effect transistor (FET) over a semiconductor substrate such as a Si substrate, where the substrate is used as a channel, an organic TFT where an organic material is used as a channel, or the like can be provided.

Figure 6A:
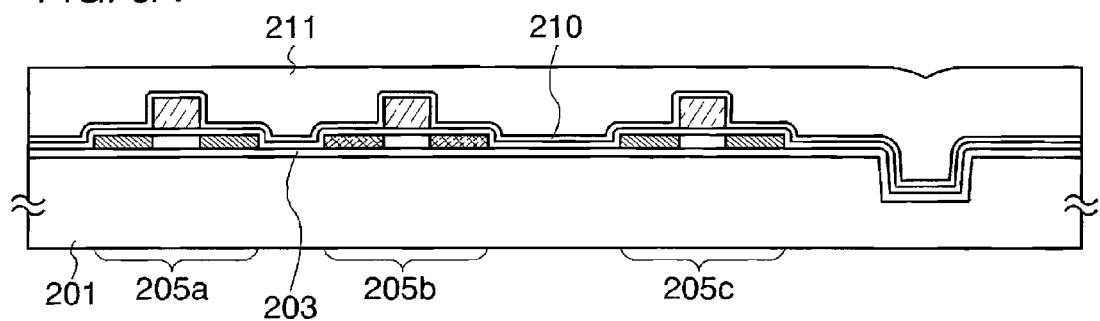
FIGS. 6A to 6C are views each showing one example of a thin film transistor included in a semiconductor device according to the present invention.
Figure 6B:
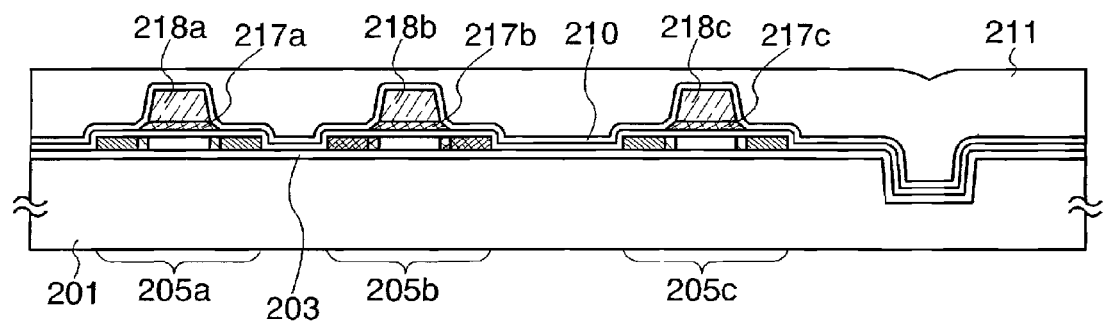
Figure 6C:
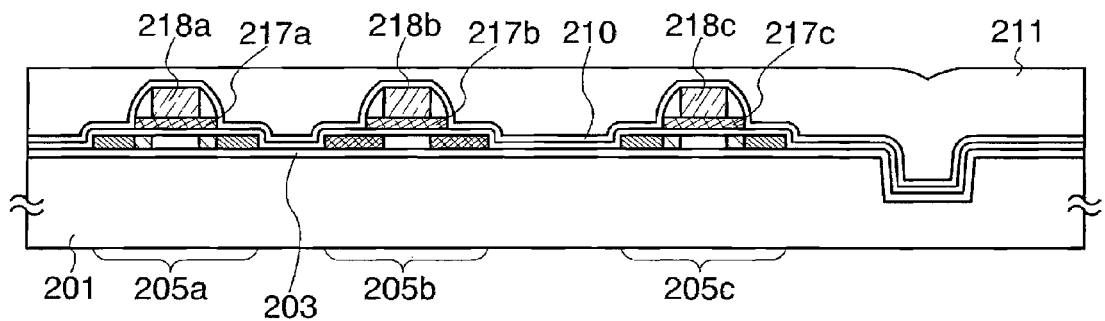

In addition, the structure of a thin film transistor included in a semiconductor device of the present invention is not limited to that described above. For example, in FIG. 3D, LDD regions are provided in the semiconductor films 206a and 206c located below the insulating films 209a and 209c which are each formed on the side faces of the n-channel thin film transistors 205a and 205c, but not provided in the p-channel thin film transistor 205b. However, the LDD regions may be provided in both of them, or the LDD regions and the sidewalls may be provided in neither of them (FIG. 6A). In addition, the structure of the thin film transistor is not limited to those described above, and the structure may be a single gate structure in which one channel forming region is formed, a multi-gate structure such as a double gate structure where two channel forming regions are formed or a triple gate structure where three channel forming regions are formed. Moreover, the structure may be a bottom gate structure or a dual gate structure including two gate electrodes each positioned above and below a channel forming region with a gate insulating film interposed therebetween. In a case of forming a gate electrode to have a stacked structure of first conductive films 217a to 217c and second conductive films 218a to 218c each provided over the first conductive films 217a to 217c, the gate electrode can also have a structure where the first conductive films 217a to 217c are formed in a tapered shape and LDD regions are each formed so as to overlap with the first conductive films 217a to 217c but not with the second conductive films 218a to 218c (FIG. 6B). Further, in a case of forming a gate electrode with the stacked structure of first conductive films 217a to 217c and second conductive films 218a to 218c each provided over the first conductive films 217a to 217c, the gate electrode can also have a structure where each sidewall is formed so as to be in contact with each side face of the second conductive films 218a to 218c and formed over the first conductive films 217a to 217c (FIG. 6C). Furthermore, in the above structures, an impurity region serving as a source or drain region of the semiconductor film can also be formed with silicide of Ni, Co, W, Mo, or the like.

Note that the structures shown in this embodiment mode can be used by being combined. In other words, the materials, the manufacturing methods, and the like shown in FIGS. 3A to 3E, FIGS. 4A to 4D, FIGS. 5A and 5B, and FIGS. 6A to 6C can be implemented by being arbitrarily combined.

Embodiment Mode 2

This embodiment mode will explain a manufacturing method of a semiconductor device different from the manufacturing method shown in the above embodiment mode with reference to drawings.

Figure 7A:
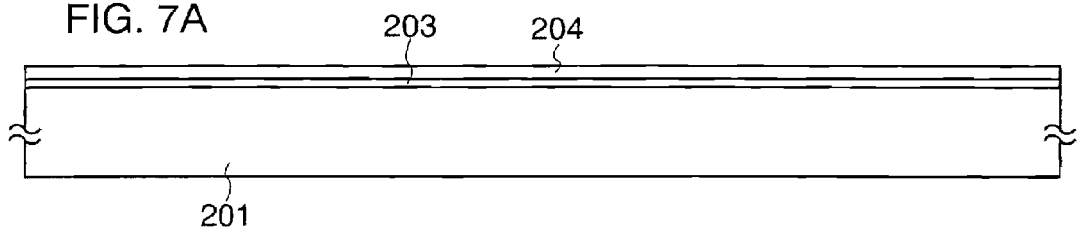
FIGS. 7A to 7E are views each showing one example of a manufacturing method of a semiconductor device according to the present invention.

First, a semiconductor film 204 is formed over an upper surface of a substrate 201 with an insulating film 203 serving as a base film interposed therebetween (FIG. 7A).

Figure 7B:
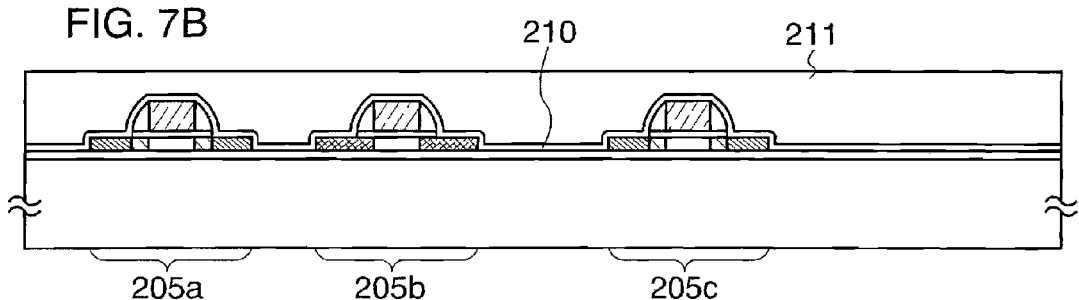

Next, thin film transistors 205a to 205c where the semiconductor film 204 is used as a channel region are formed, and an insulating film 210 and an insulating film 211 are formed so as to cover the thin film transistors 205a to 205c (FIG. 7B).

Figure 7C:
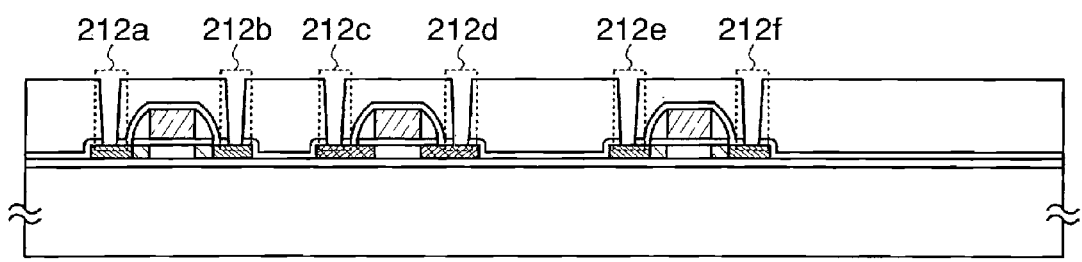

Then, by selectively removing the insulating film 211, the insulating film 210, and the like, openings 212a to 212f each reaching parts of semiconductor films 206a to 206c, which are to be source or drain regions of the thin film transistors 205a to 205c, are formed (FIG. 7C).

Figure 7D:
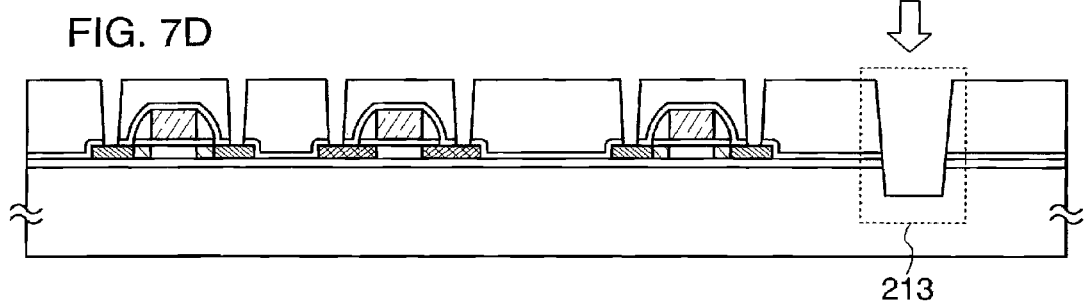

Next, by selectively removing the insulating film 203, the insulating film 210, the insulating film 211, the substrate 201, and the like, an opening 213 is formed so as to form a depression in the upper surface of the substrate 201 (FIG. 7D). Note that the opening 213 may be provided before forming the openings 212a to 212f.

Figure 7E:
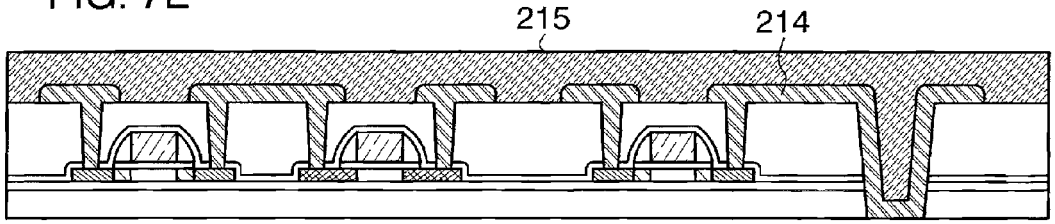

Thereafter, with the use of the methods shown in the above embodiment mode, it is possible to obtain a semiconductor device where a thin film transistor can be electrically connected in a back surface of a substrate opposite to the upper surface provided with the thin film transistor by thinning the substrate 201 after forming a conductive film 214 and an insulating film 215 (FIG. 7E).

In other words, in the manufacturing method of a semiconductor device shown in FIGS. 7A to 7E, the opening is formed before or after forming the openings 212a to 212f so as to form a depression in the upper surface of the substrate 201. Therefore, there is an advantage that the steps can be simplified compared with the methods shown in the above Embodiment Mode 1.

In addition, as another structure of this embodiment mode, the opening may be formed so as to penetrate the substrate 201. One example of the manufacturing method of this case will be hereinafter explained with reference to FIGS. 8A to 8D.

Figure 8A:
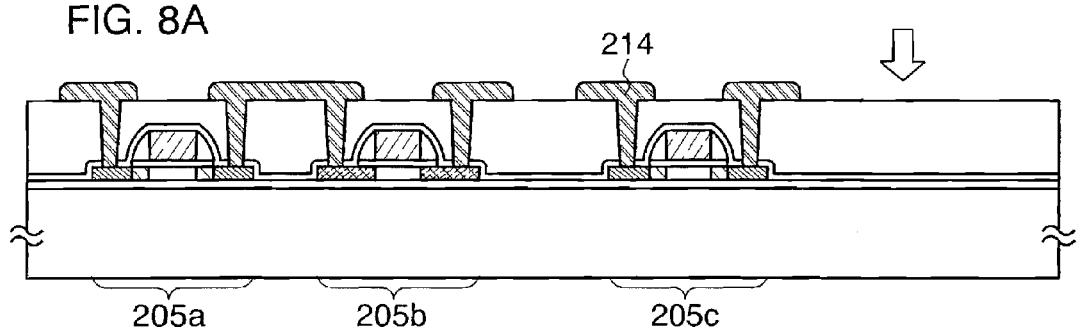
FIGS. 8A to 8D are views each showing one example of a manufacturing method of a semiconductor device according to the present invention.

First, as well as in FIG. 7C, thin film transistors 205a to 205c and openings 212a to 212f are formed over a substrate 201, and a conductive film 214 is formed by a CVD method, a sputtering method, or the like (FIG. 8A).

Figure 8B:
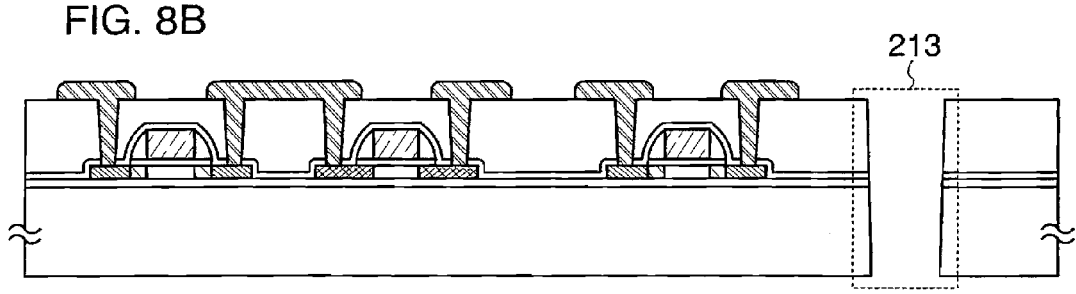

Next, by selectively removing an insulating film 203, an insulating film 210, an insulating film 211, the substrate 201, and the like, an opening 213 is formed so as to penetrate the substrate 201 (FIG. 8B). The opening 213 may be provided before forming the openings 212a to 212f or before forming the conductive film 214 in the openings 212a to 212f.

Figure 8C:
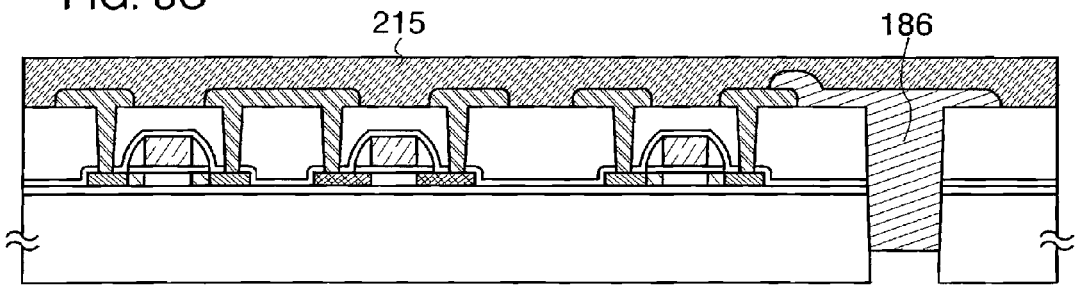

Then, a conductive material 186 is formed in the opening 213 (FIG. 8C). Here, an example of selectively providing the conductive material 186 in the opening 213 by a screen printing method is shown. However, as described above, the conductive material 186 may be provided concurrently with the conductive film 214 or the conductive material 186 can also be provided by being stacked after providing the conductive film 214. In addition, a conductive film to be provided in the opening 213 is preferably provided below the insulating film 203, and the opening 213 may be entirely filled or may be partially filled.

Figure 8D:
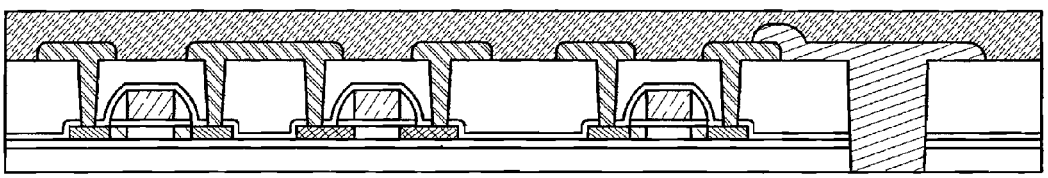
Figure 9:
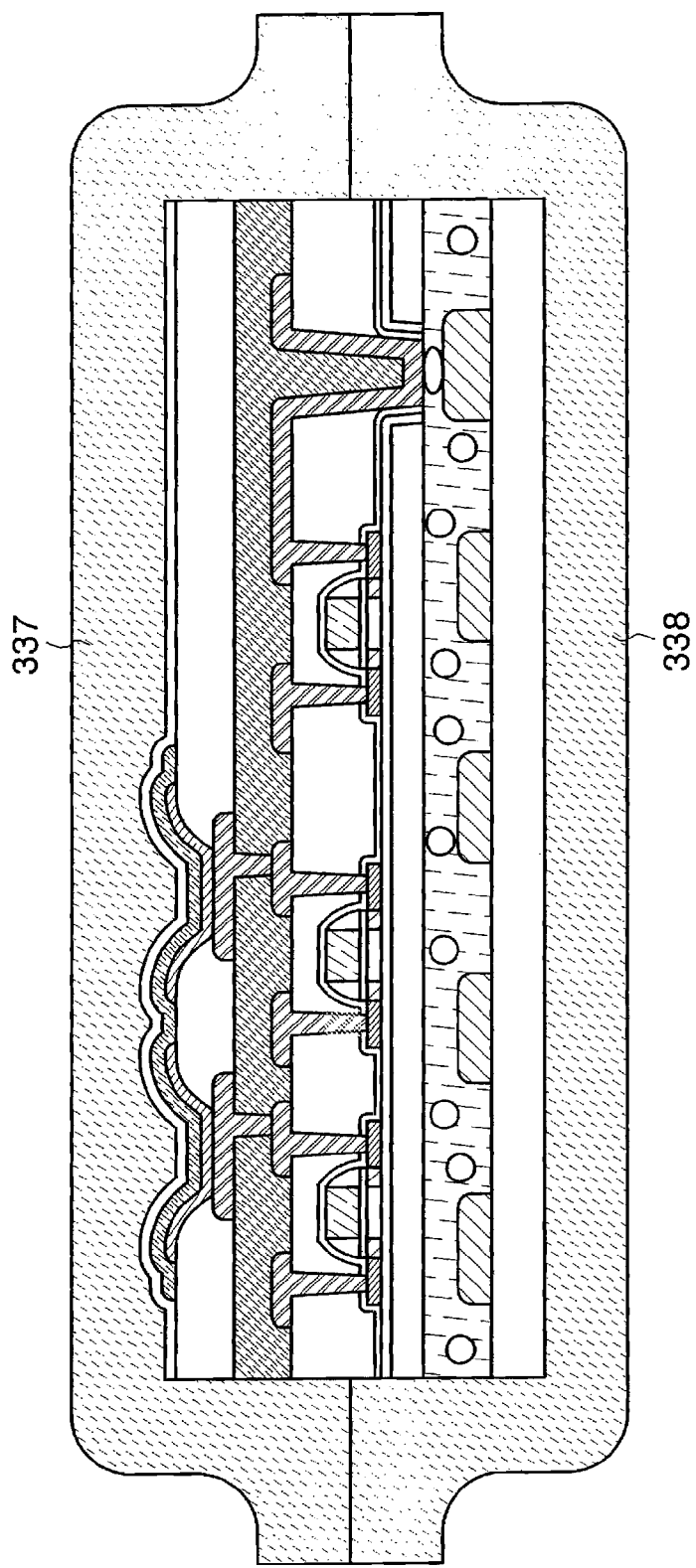
FIG. 9 is a view showing one example of a usage pattern of a semiconductor device according to the present invention.

Thereafter, as shown in the above embodiment mode, by performing grinding treatment, polishing treatment, an etching by chemical treatment, or the like from a back surface of substrate 201, the substrate 201 is thinned and a conductive film (here, the conductive material 186) provided in an opening is exposed. Through the above steps, it is possible to obtain a semiconductor device where a semiconductor element such as a thin film transistor, which is formed over an upper surface of a substrate, can be electrically connected in a back surface of the substrate with the substrate interposed therebetween (FIG. 8D).

Note that this embodiment mode can be implemented by being arbitrarily combined with the above embodiment mode. In other words, the materials and the manufacturing methods shown in the above embodiment mode can be implemented by being arbitrarily combined with this embodiment mode, and the materials and the manufacturing methods shown in this embodiment mode can also be implemented by being arbitrarily combined with the above embodiment mode.

Embodiment Mode 3

In a semiconductor device of the present invention, by using the manufacturing method shown in the above embodiment mode, a semiconductor element is provided over an upper surface of a substrate, and there can be electrical connection between the semiconductor element and a back surface of the substrate. Hereinafter, usage patterns of a semiconductor device of the present invention will be explained.

First, a usage pattern of a semiconductor device where a plurality of functions is integrated will be explained with reference to FIGS. 10A to 10C.

Figure 10A:
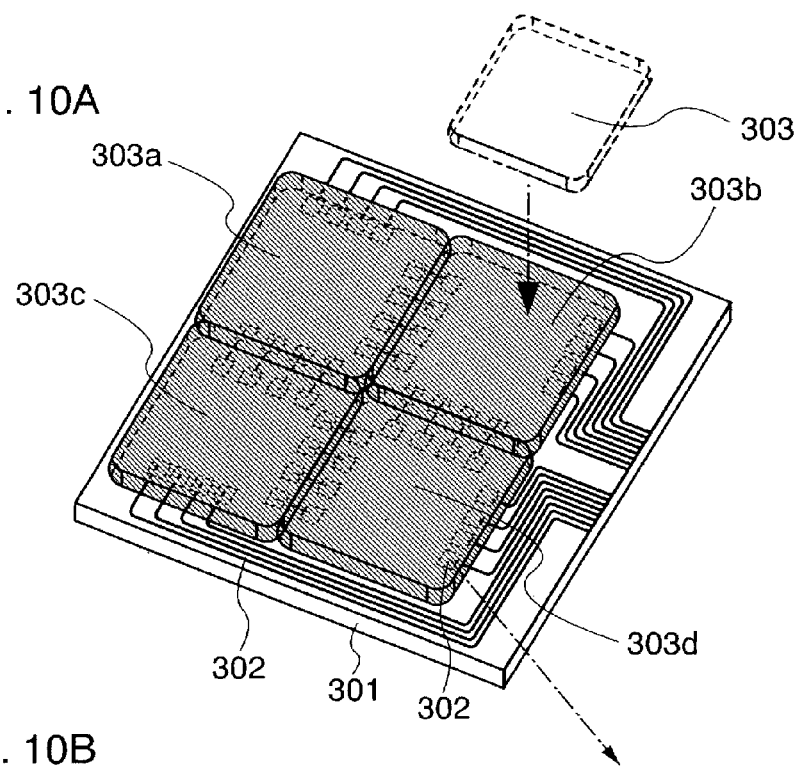
FIGS. 10A to 10C are views each showing one example of a usage pattern of a semiconductor device according to the present invention.

A semiconductor device shown in FIG. 10A is provided by attaching a semiconductor device 303 having any of structures shown in the above embodiment mode over a substrate 301 provided with a conductive film 302. Here, a plurality of semiconductor devices 303a to 303d is provided over the substrate 301 so as to be electrically connected to the conductive film 302. The substrate 301 and the semiconductor devices 303a to 303d can be attached to each other with a resin 312 having adhesiveness, and the semiconductor devices 303a to 303d and the conductive film 302 can be electrically connected to each other through conductive particles 311 contained in the resin 312 having adhesiveness. Besides, the semiconductor devices 303a to 303d and the conductive film 302 can also be electrically connected to each other by a conductive adhesive such as a silver paste, a copper paste, or a carbon paste; an anisotropic conductive adhesive such as an ACP (Anisotropic Conductive Paste); a conductive film such as an ACF (Anisotropic Conductive Film); a solder connection; or the like.

Figure 10B:
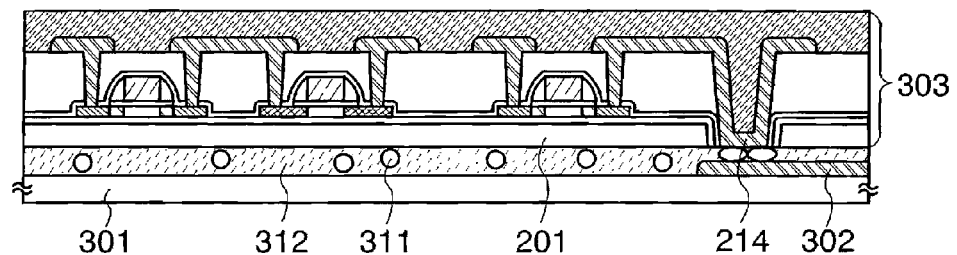
Figure 10C:
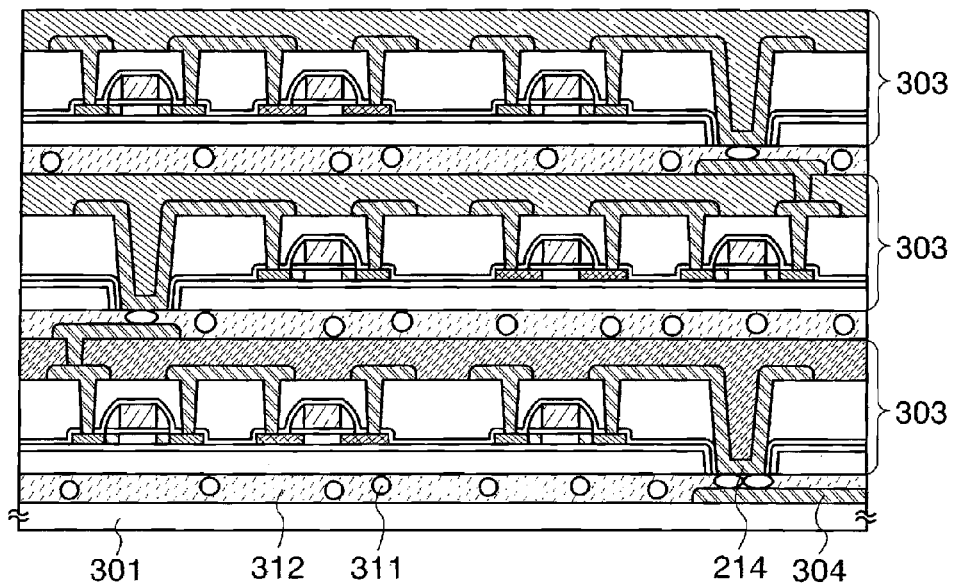

As shown in FIG. 10B, the semiconductor devices 303a to 303d and the conductive film 302 are electrically connected to each other with the conductive particles 311 interposed between the conductive film 214 that is exposed to the back surface (a surface opposite to the upper surface provided with a semiconductor element such as a thin film transistor) of the substrate 301 and the conductive film 302 through an opening provided in the substrate 301. The semiconductor devices 303a to 303d each serve as one or a plurality of a central processing unit (CPU), a memory, a network processing circuit, a disk processing circuit, an image processing circuit, an audio processing circuit, a power supply circuit, a temperature sensor, a humidity sensor, an infrared sensor, and the like.

In addition, in this embodiment mode, it is also possible to provide a plurality of the semiconductor devices 303 in a multilayer. In this case, a plurality of the semiconductor devices 303 can be provided in a multilayer by electrically connecting to each other the conductive film 214 provided over the back surface of the substrate 301 of a semiconductor device and a semiconductor element such as a thin film transistor (FIG. 10C). Thus, high integration and downsizing are enabled by providing a plurality of the semiconductor devices in a multilayer, even when a plurality of the semiconductor devices is provided by being electrically connected to each other.

Moreover, a semiconductor device of the present invention can also be applied to a semiconductor device which can transmit and receive data without contact (also referred to as an RFID (Radio Frequency Identification) tag, an ID tag, an IC tag, an IC chip, an RF (Radio Frequency) tag, a wireless tag, an electronic tag, or a wireless chip).

Figure 11A:
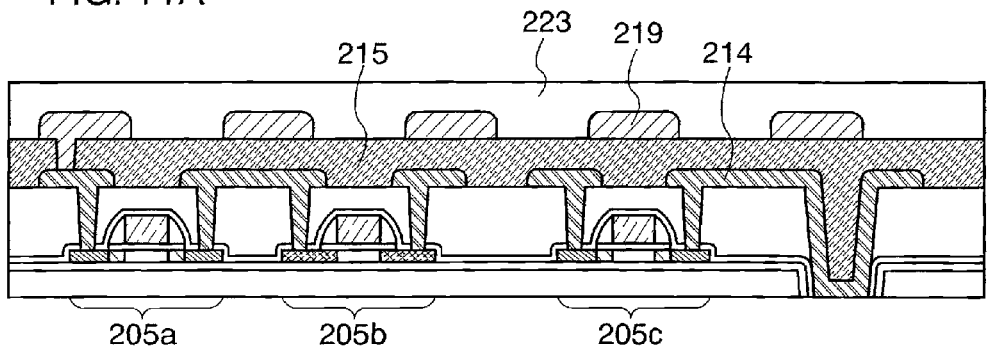
FIGS. 11A to 11C are views each showing one example of a usage pattern of a semiconductor device according to the present invention.

In the manufacturing method shown in the above FIGS. 4A to 4D, before thinning the substrate 201 (FIG. 4B), a conductive film 219 serving as an antenna is formed so that at least one of transistors 205a to 205c is electrically connected over an insulating film 215. Then, a flexible semiconductor device which can transmit and receive data without contact can be manufactured by forming an insulating film 223 serving as a protective film so as to cover the conductive film 219 and continuously thinning or removing the substrate 201 (FIG. 11A).

The conductive film 219 is formed with a conductive material by a CVD method, a sputtering method, a printing method such as screen printing or gravure printing, a droplet discharging method, a dispenser method, or the like. The conductive material is formed with a single-layer structure of an element of aluminum (Al), titanium (Ti), silver (Ag), copper (Cu), gold (Au), and nickel (Ni), or an alloy material or a compound material containing these elements as its main component; or a stacked structure thereof.

The insulating film 223 can be provided by a CVD method, a sputtering method, or the like with a single-layer structure of an insulating film containing oxygen and/or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film, or a film containing carbon such as a DLC (diamond like carbon) film; or a stacked structure thereof. In addition, the insulating film 223 can be provided by a spin coating method, a screen printing method, a droplet discharging method, or the like with a single-layer structure of an organic material such as epoxy, polyimide, polyamide, polyvinyl phenol, benzocyclobutene, or acrylic, or a siloxane material such as siloxane resin; or a stacked structure thereof.

Figure 11B:
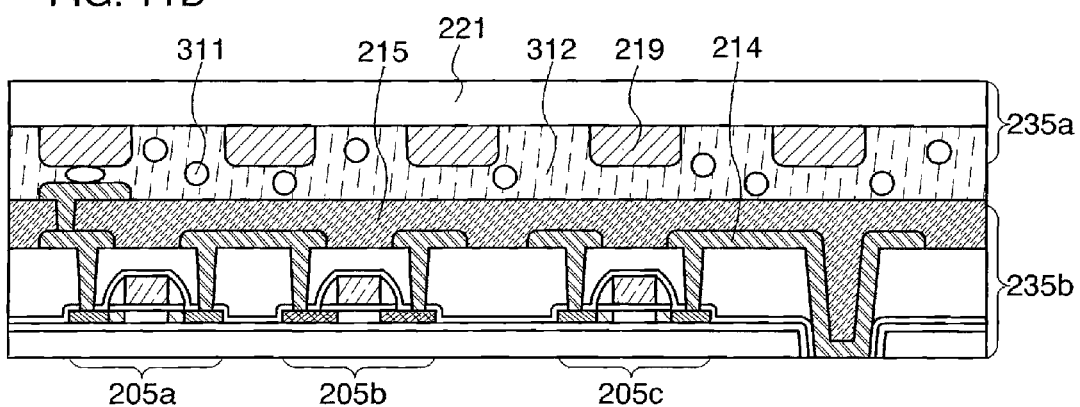

Note that, besides, the conductive film 219 serving as an antenna can also be provided so as to be electrically connected after being separately formed from a semiconductor element. For example, in the manufacturing method shown in FIGS. 4A to 4D, before thinning the substrate 201 (FIG. 4B), a flexible semiconductor device which can transmit and receive data without contact can be manufactured by attaching a conductive film 219 serving as an antenna, which is provided over a substrate 221, and a semiconductor element such as a transistor, which is provided over the substrate 201, so as to electrically connect to each other, and by continuously thinning or removing the substrate 201 (FIG. 11B).

As for the substrate 221, a flexible material such as plastic may be used in advance. Alternatively, the substrate 201 and the substrate 221 can be attached and then the both substrates can be thinned and removed. In this case, the same material as that of the substrate 201 can be used for the substrate 221. In addition, a layer 235a including the substrate 221 over which the conductive film 219 serving as an antenna is provided can be attached to a layer 235b provided over the substrate 201, which includes a semiconductor element such as a transistor, with a resin 312 having adhesiveness, and a conductive film 214 can be electrically connected to the conductive film 219 serving as an antenna through conductive particles 311 included in the resin 312 having adhesiveness. Besides, the conductive film 214 can also be electrically connected to the conductive film 219 serving as an antenna by a conductive adhesive such as a silver paste, a copper paste, or a carbon paste; a conductive adhesive such as an ACP; a conductive film such as an ACF; a solder connection; or the like.

Figure 11C:
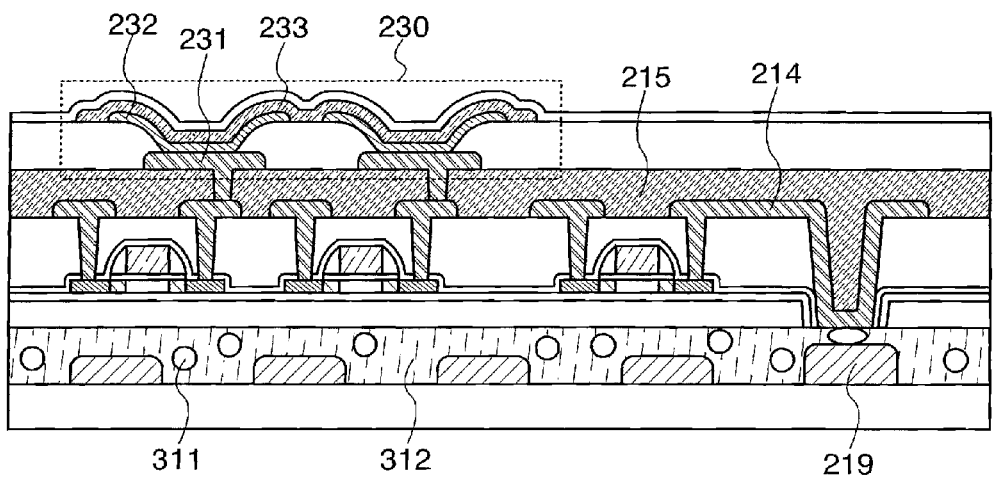

Moreover, in a case of electrically connecting the conductive film 219 serving as an antenna after being formed separately from a semiconductor element, it is also possible to electrically connect the conductive film 219 to a conductive film 214 provided over the back surface of the substrate 201 (FIG. 11C). By electrically connecting the conductive film 219 serving as an antenna to a semiconductor element such as a transistor with the use of the back surface of the substrate 201 in such a manner, a memory element or a sensor element can be provided above the semiconductor element. Here, an example of providing a memory element portion 230 formed of a stacked structure of a first conductive film 231, an element 232, and a second conductive film 233 is shown. The element 232 can be formed with a material the property or state of which is changed due to an electric effect, an optical effect, a thermal effect, or the like. For example, it is preferable to use a material the property or state of which is changed due to fusing by Joule heat, dielectric breakdown, or the like, and the bottom electrode and the upper electrode of which can be short-circuited. Therefore, a layer used for the element 232 has a thickness of 5 to 100 nm, preferably, 10 to 60 nm.

The element 232 can be formed using an organic compound layer, for example. The organic compound layer is formed by a droplet discharging method, a spin coating method, a vapor deposition method, or the like. For example, the following materials can be used as an organic material used for the organic compound layer: an aromatic amine-based compound (that is, a compound having a bond of a benzene ring and nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), 4,4',4"-tris[N-(3-methylphenyl)-N-phenyl-amino]triphenylamine (abbreviation: MTDATA), or 4,4'-bis(N-(4-(N,N-di-m-tolylamino)phenyl)-N-phenylamino)biphenyl (abbreviation: DNTPD), polyvinyl carbazole (abbreviation: PVK); a phthalocyanine compound such as phthalocyanine (abbreviation: $H_2Pc$), copper phthalocyanine (abbreviation: CuPc), or vanadyl phthalocyanine (abbreviation: VOPc); or the like. These materials are each a substance having a high hole transporting property.

Besides, for example, the following materials can be used as the organic material: a material formed from a metal complex having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq); or a material such as a metal complex having an oxazole-based and thiazole-based ligand such as bis[2-(2'-hydroxyphenyl)benzoxazolato]zinc (abbreviation: $Zn(BOX)_2$) or bis[2-(2'-hydroxyphenyl)benzothiazolato]zinc (abbreviation: $Zn(BTZ)_2$). These materials are each a substance having a high electron transporting property.

Further, other than the metal complexes, the following compound or the like can be used: 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), or bathocuproin (abbreviation: BCP).

In addition, the organic compound layer may be a single-layer structure or a stacked structure. In a case of a stacked structure, the stacked structure can be formed by selecting from the above materials. Moreover, the above organic materials and a light-emitting material may be stacked. The following material can be given as the light-emitting material: 4-(dicyanomethylene)-2-methyl-6-[2-(1,1,7,7-tetramethyljulolidin-9-yl)ethenyl]-4H-pyran (abbreviation: DCJT), 4-(dicyanomethylene)-2-tert-butyl-6-[2-(1,1,7,7-tetramethyljulolidin-9-yl)ethenyl]-4H-pyran, periflanthene, 1,4-bis[2-(10-methoxy-1,1,7,7-tetramethyljulolidin-9-yl)ethenyl]-2,5-dicyanobenzene, N,N'-dimethylquinacridone (abbreviation: DMQd), coumarin 6, coumarin 545T, tris(8-quinolinolato)aluminum (abbreviation: $Alq_3$), 9,9-bianthryl, 9,10-diphenylanthracene (abbreviation: DPA), 9,10-di(2-naphthyl)anthracene (abbreviation: DNA), 2,5,8,11-tetra-t-butylperylene (abbreviation: TBP), and the like.

Moreover, a layer in which the above light-emitting material is dispersed may be used. In the layer in which the light-emitting material is dispersed, the following materials can be used as a material serving as a host material: an anthracene derivative such as 9,10-di(2-naphthyl)-2-tert-butylanthracene (abbreviation: t-BuDNA), a carbazole derivative such as 4,4'-bis(N-carbazolyl)biphenyl (abbreviation: CBP), a metal complex such as bis[2-(2'-hydroxyphenyl)pyridinato]zinc (abbreviation: $Znpp_2$), or bis[2-(2'-hydroxyphenyl)benzoxazolato]zinc (abbreviation: ZnBOX), or the like. In addition, tris(8-quinolinolato)aluminum (abbreviation: $Alq_3$), 9,10-di(2-naphthyl)anthracene (abbreviation: DNA), bis(2-methyl-8-quinolinolato)-4-phenylphenolato-aluminum (abbreviation: BAlq), or the like can be used.

The organic material described above preferably has a glass transition temperature (Tg) from 50 to 300° C., preferably 80 to 120° C., so that the property of the organic material is changed by a thermal effect or the like.

Further, a material in which metal oxide is mixed into an organic material or a light-emitting material may be used. The material in which metal oxide is mixed includes a state of mixing or stacking the organic material or the light-emitting material and the metal oxide. Specifically, the material in which metal oxide is mixed refers to a state of being formed by a co-evaporation method using a plurality of evaporation sources. Such a material can be referred to as an organic-inorganic composite material.

For example, in a case of mixing a substance having a high hole transporting property with metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, or tantalum oxide as the metal oxide.

In a case of mixing a substance having a high electron transporting property with metal oxide, it is preferable to use lithium oxide, calcium oxide, sodium oxide, potassium oxide, or magnesium oxide as the metal oxide.

A material the property of which is changed by an electric effect, an optical effect, or a thermal effect may be used for the organic compound layer; therefore, for example, a conjugated polymer doped with a compound (photoacid generator) generating acid by absorbing light can also be used. Here, polyacetylenes, polyphenylenevinylenes, polythiophenes, polyanilines, polyphenylene ethynylenes, or the like can be used as the conjugated polymer. In addition, as the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like can be used.

Although an example of using the organic compound material as the element 232 is shown here, the present invention is not limited thereto. For example, it is possible to use a phase change material such as a material which changes reversibly between a crystalline state and an amorphous state or a material which changes reversibly between a first crystalline state and a second crystalline state. In addition, it is also possible to use a material which changes only from an amorphous state to a crystalline state.

A material which reversibly changes between a crystalline state and an amorphous state in the phase change layer is a material containing a plurality of elements of germanium (Ge), tellurium (Te), antimony (Sb), sulfur (S), tellurium oxide (TeOx), tin (Sn), gold (Au), gallium (Ga), selenium (Se), indium (In), thallium (Tl), cobalt (Co), and silver (Ag). For example, a material based on Ge—Te—Sb—S, Te—$TeO_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te can be used. In addition, a material which reversibly changes between the first crystalline state and the second crystalline state is a material containing a plurality of silver (Ag), zinc (Zn), copper (Cu), aluminum (Al), nickel (Ni), indium (In), antimony (Sb), selenium (Se), and tellurium (Te), for example, Te—$TeO_2$, Te—$TeO_2$—Pd, and $Sb_2Se_3/Bi_2Te_3$. In using this material, a phase change is performed between two different crystalline states. In addition, a material which changes only from an amorphous state to a crystalline state is a material containing a plurality of tellurium (Te), tellurium oxide (TeOx), antimony (Sb), selenium (Se), and bismuth (Bi), for example, Ag—Zn, Cu—Al—Ni, In—Sb, In—Sb—Se, and In—Sb—Te.

The first conductive film 231 and the second conductive film 233 can be formed by a CVD method, a sputtering method, a screen printing method, a droplet discharging method, a dispenser method, or the like with a single-layer structure of an element of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), and carbon (C), or an alloy containing a plurality of the elements; or a stacked structure thereof. Besides, a single-layer film such as an indium tin oxide film (ITO film), an indium tin oxide film containing silicon, a zinc oxide (ZnO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and another titanium nitride film; or the like can be used. Note that, in a case of a stacked structure, resistance as a wiring can also be reduced.

Next, a usage pattern of a semiconductor device serving as an IC card will be explained (FIGS. 12A to 12D).

Figure 12A:
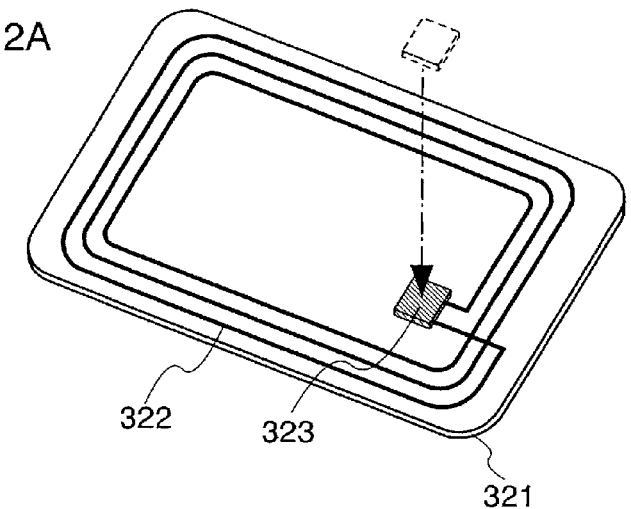
FIGS. 12A to 12D are views each showing one example of a usage pattern of a semiconductor device according to the present invention.

A semiconductor device 323 is provided by being attached over a substrate 321. Specifically, the semiconductor device 323 is provided by electrically connecting a semiconductor element included in the semiconductor device 323 and a conductive film 322 provided over the substrate 321, which serves as an antenna (FIG. 12A).

Figure 12B:
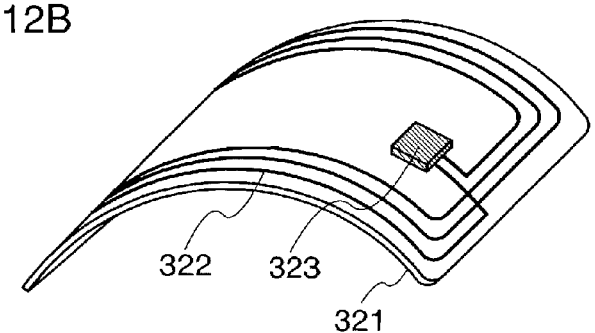
Figure 12C:
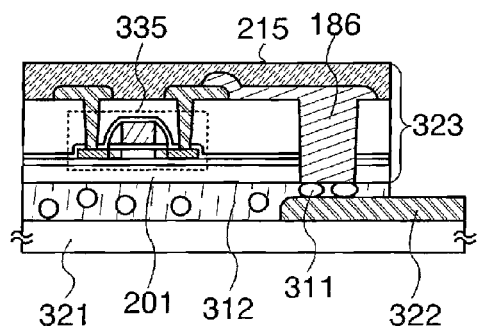
Figure 12D:
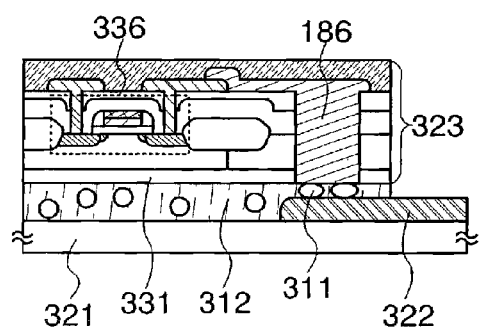

The semiconductor element and the conductive film 322 serving as an antenna are electrically connected by being electrically connected to a conductive material 186 located in the back surface of a substrate provided with the semiconductor element (a surface opposite to the upper surface provided with the semiconductor element) (FIGS. 12C and 12D). Here, the conductive material 186 electrically connected to a thin film transistor 335, which is provided over a substrate 201, and the conductive film 322 serving as an antenna can be electrically connected in the back surface of the substrate 201 with conductive particles 311 interposed therebetween (FIG. 12C). The transistor to be provided in the semiconductor element is not limited to a thin film transistor. A conductive material 186 electrically connected to a transistor 336 where a semiconductor substrate 331 such as a Si substrate is used as a channel region, which is provided over the semiconductor substrate 331, and a conductive film 322 serving as an antenna can be electrically connected in the back surface of the semiconductor substrate 331 with conductive particles 311 interposed therebetween (FIG. 12D).

In addition, by using a flexible substrate such as plastic for the substrate 321, a semiconductor device serving as an IC card can also be bent; thus, it is possible to provide an IC card with added value (FIG. 12B).

Next, operation of a semiconductor device which can exchange data without contact will be hereinafter explained with reference to drawings.

Figure 13A:
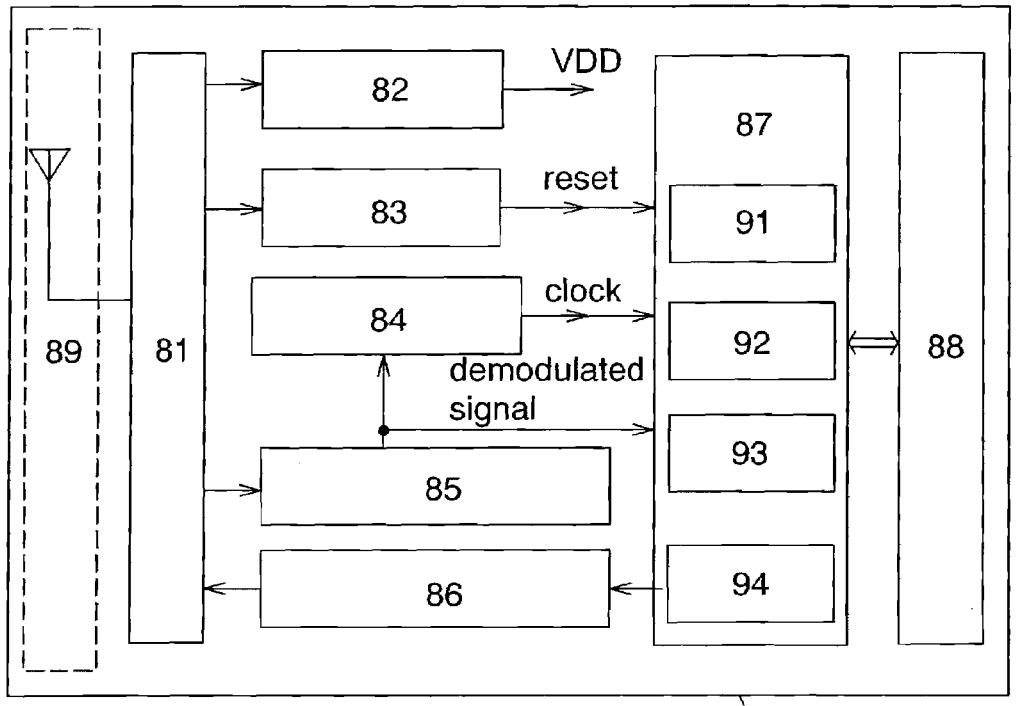
FIGS. 13A to 13C are a diagram and views each showing one example of a usage pattern of a semiconductor device according to the present invention.

A semiconductor device 80 has the function of communicating data without contact, and includes a high frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 13A). The high frequency circuit 81 is a circuit which receives a signal from the antenna 89 and outputs a signal received by the data modulation circuit 86 from the antenna 89. The power supply circuit 82 is a circuit which generates power supply potential from the received signal. The reset circuit 83 is a circuit which generates a reset signal. The clock generation circuit 84 is a circuit which generates various clock signals based on the received signal inputted from the antenna 89. The data demodulation circuit 85 is a circuit which demodulates the received signal and outputs the signal to the control circuit 87. The data modulation circuit 86 is a circuit which modulates a signal received from the control circuit 87. As the control circuit 87, a code extraction circuit 91, a code determination circuit 92, a CRC determination circuit 93, and an output unit circuit 94 are provided, for example. Note that the code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC circuit is a circuit which detects the presence or absence of a transmission error or the like based on the determined code.

In addition, the number of memory circuits to be provided is not limited to one, and may be plural. An SRAM, a flash memory, a ROM, an FeRAM, or the like, or a circuit using the organic compound layer in a memory element portion can be used.

Then, an example of operation of a semiconductor device which can communicate data without contact of the present invention will be explained. First, a radio signal is received by the antenna 89. The radio signal is transmitted to the power supply circuit 82 via the high frequency circuit 81, and high power supply potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, a demodulated signal). Further, a signal transmitted through the reset circuit 83 and the clock generation circuit 84 via the high frequency circuit 81 and the demodulated signal are transmitted to the control circuit 87. The signal transmitted to the control circuit 87 is analyzed by the code extraction circuit 91, the code determination circuit 92, the CRC assessment circuit 93, and the like. Then, in accordance with the analyzed signal, information of the semiconductor device stored in the memory circuit 88 is outputted. The outputted information of the semiconductor device is encoded through the output unit circuit 94. Furthermore, the encoded information of the semiconductor device 80 is transmitted by the antenna 89 as a radio signal through the data modulation circuit 86. Note that low power supply potential (hereinafter, VSS) is common among a plurality of circuits included in the semiconductor device 80, and VSS can be set to GND.

Thus, data of the semiconductor device can be read by transmitting a signal from a reader/writer to the semiconductor device 80 and receiving the signal transmitted from the semiconductor device 80 by the reader/writer.

In addition, the semiconductor device 80 may supply a power supply voltage to each circuit by an electromagnetic wave without a power source (battery) mounted, or by an electromagnetic wave and a power source (battery) with the power source (battery) mounted.

Since a semiconductor device which can be bent can be manufactured by using the structure shown in the above embodiment mode, the semiconductor device can be provided over an object having a curved surface by attachment.

Figure 13B:
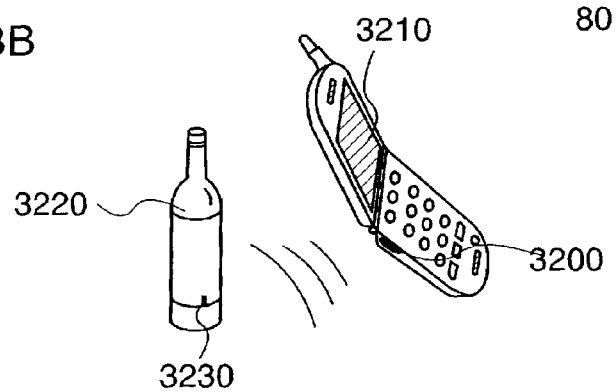
Figure 13C:
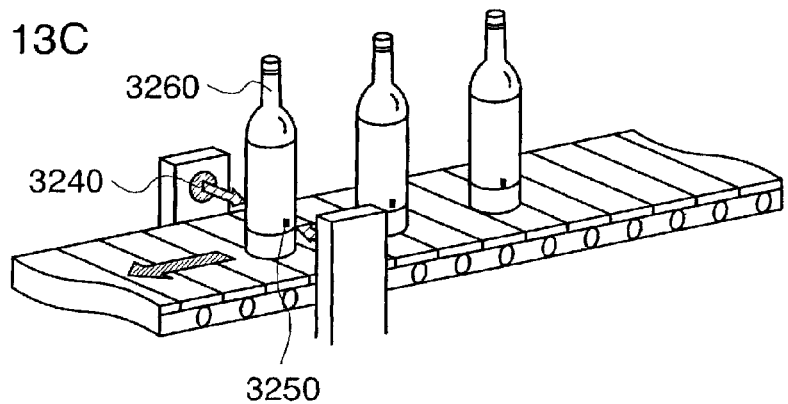

Next, an example of a usage pattern of a semiconductor device which can exchange data without contact will be explained. A side face of a portable terminal including a display portion 3210 is provided with a reader/writer 3200, and a side face of an article 3220 is provided with a semiconductor device 3230 (FIG. 13B). When the reader/writer 3200 is held over the semiconductor device 3230 included in the article 3220, information on the article 3220 such as a raw material, the place of origin, an inspection result in each production process, the history of distribution, or an explanation of the article is displayed on the display portion 3210. In addition, when a product 3260 is transported by a conveyor belt, the product 3260 can be inspected using a reader/writer 3240 and a semiconductor device 3250 provided over the product 3260 (FIG. 13C). Thus, by utilizing the semiconductor device for a system, information can be acquired easily, and improvement in functionality and added value of the system can be achieved. As shown in the above embodiment mode, a transistor or the like included in a semiconductor device can be prevented from being damaged even when the semiconductor device is attached to an object having a curved surface, and a reliable semiconductor device can be provided.

In addition, as a signal transmission method in the above semiconductor device which can exchange data without contact, an electromagnetic coupling method, an electromagnetic induction method, a microwave method, or the like can be used. The transmission system may be appropriately selected by a practitioner in consideration of an intended use, and an optimum antenna may be provided in accordance with the transmission method.

In a case of employing, for example, an electromagnetic coupling method or an electromagnetic induction method (for example, a 13.56 MHz band) as the signal transmission method in the semiconductor device, electromagnetic induction is caused by a change in magnetic field density. Therefore, the conductive film serving as the antenna is formed in an annular shape (for example, a loop antenna) or a spiral shape (for example, a spiral antenna).

Figure 20C:
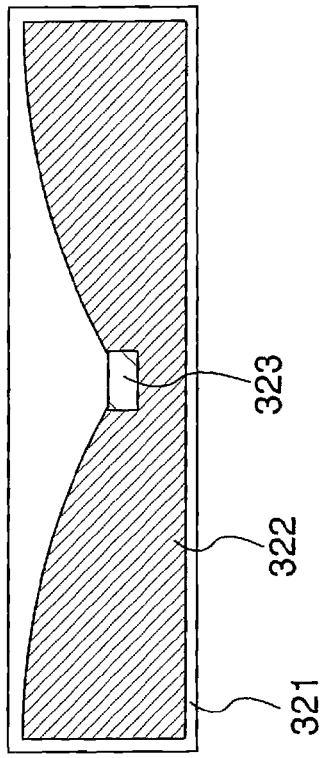
FIGS. 20A to 20D are views each showing one example of a usage pattern of a semiconductor device according to the present invention.
Figure 20D:
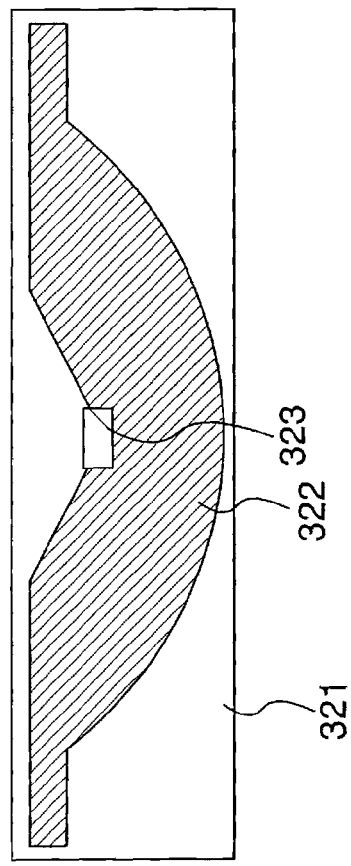
Figure 20A:
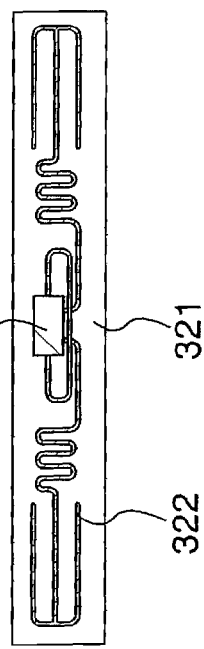
Figure 20B:
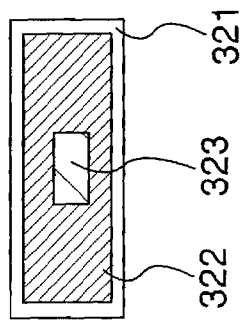

In a case of employing, for example, a microwave method (for example, a UHF band (860 to 960 MHz band), a 2.45 GHz band, or the like) as the signal transmission method in the semiconductor device, the shape such as a length of the conductive film serving as an antenna may be appropriately set in consideration of a wavelength of an electromagnetic wave used for signal transmission. For example, the conductive film serving as an antenna can be formed in a linear shape (for example, a dipole antenna (FIG. 20A)), a flat shape (for example, a patch antenna (FIG. 20B)), a ribbon shape (FIGS. 20C and 20D), or the like. The shape of the conductive film serving as an antenna is not limited to a linear shape, and the conductive film serving as an antenna may be provided in a curved-line shape, a meander shape, or a combination thereof, in consideration of a wavelength of an electromagnetic wave.

The conductive film serving as an antenna is formed with a conductive material by a CVD method, a sputtering method, a printing method such as screen printing or gravure printing, a droplet discharging method, a dispenser method, a plating method, or the like. The conductive material is formed with a single-layer structure of an element of aluminum (Al), titanium (Ti), silver (Ag), copper (Cu), gold (Au), platinum (Pt), nickel (Ni), palladium (Pd), tantalum (Ta) and molybdenum (Mo) or an alloy material or a compound material containing these elements as its main component; or a stacked structure thereof.

In a case of forming a conductive film serving as an antenna by, for example, a screen printing method, the conductive film can be provided by selectively printing conductive paste in which conductive particles each having a grain size of several nm to several tens of μm are dissolved or dispersed in an organic resin. As the conductive particles, one or more of metal particles such as silver (Ag), gold (Au), copper (Cu), nickel (Ni), platinum (Pt), palladium (Pd), tantalum (Ta), molybdenum (Mo), and titanium (Ti), fine particles of silver halide, or dispersible nanoparticles can be used. In addition, as the organic resin included in the conductive paste, one or a plurality of organic resins each serving as a binder, a solvent, a dispersant, or a coating of the metal particle can be used. Typically, an organic resin such as an epoxy resin or a silicon resin can be used. In forming a conductive film, baking is preferably performed after the conductive paste is applied. For example, in a case of using fine particles (the grain size of which is 1 to 100 nm) containing silver as its main component as a material of the conductive paste, a conductive film can be obtained by curing the conductive paste by baking at temperatures of 150 to 300° C. Alternatively, fine particles containing solder or lead-free solder as its main component may be used; in this case, it is preferable to use a fine particle having a grain size of 20 μm or less. Solder or lead-free solder has an advantage such as low cost.

Besides the above material, ceramic, ferrite, or the like may be applied to an antenna. Further, a material of which dielectric constant and magnetic permeability are negative in a microwave band (metamaterial) can be applied to an antenna.

In a case of applying an electromagnetic coupling method or an electromagnetic induction method, and providing a semiconductor device including an antenna in contact with metal, a magnetic material having magnetic permeability is preferably provided between the semiconductor device and metal. In the case of providing a semiconductor device including an antenna in contact with metal, an eddy current flows in metal accompanying change in magnetic field, and a demagnetizing field generated by the eddy current impairs a change in magnetic field and decreases a communication distance. Therefore, an eddy current of metal and a decrease in communication range can be suppressed by providing a material having magnetic permeability between the semiconductor device and metal. Note that ferrite or a metal thin film having high magnetic permeability and little loss of high frequency wave can be used as the magnetic material.

In a case of providing an antenna, a semiconductor element such as a transistor and a conductive film serving as an antenna may be directly formed over one substrate, or a semiconductor element and a conductive film serving as an antenna may be provided over separate substrates and then attached to be electrically connected to each other.

Note that an applicable range of the flexible semiconductor device is wide in addition to the above, and the flexible semiconductor device can be applied to any product as long as it clarifies information such as the history of an object without contact and is useful for production, management, or the like. For example, the semiconductor device can be mounted on paper money, coins, securities, certificates, bearer bonds, packing containers, books, recording media, personal belongings, vehicles, food, clothing, health products, commodities, medicine, electronic devices, and the like. Examples thereof will be explained with reference to FIGS. 14A to 14H.

Figure 14A:
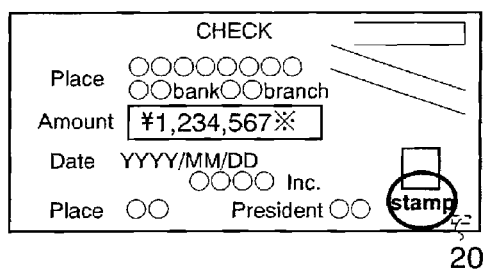
FIGS. 14A to 14H are views each showing one example of a usage pattern of a semiconductor device according to the present invention.
Figure 14B:
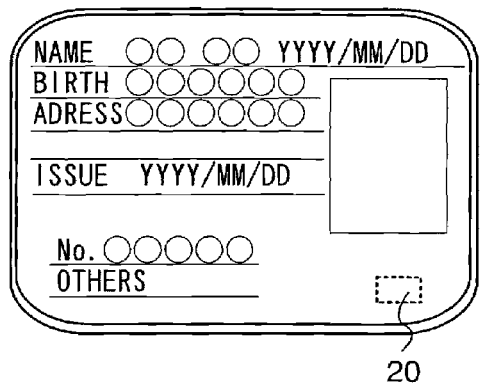
Figure 14C:
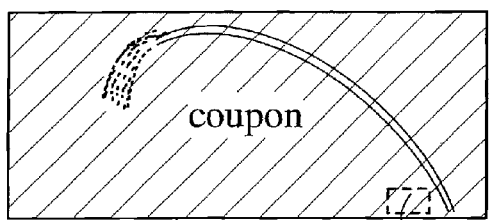
Figure 14D:
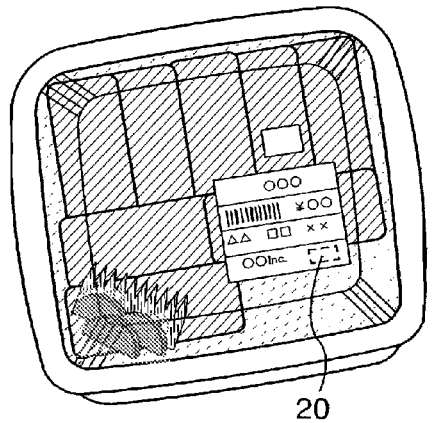
Figure 14E:
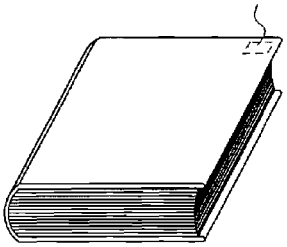
Figure 14F:
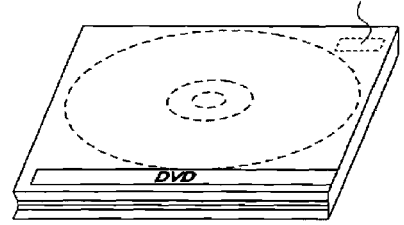
Figure 14G:
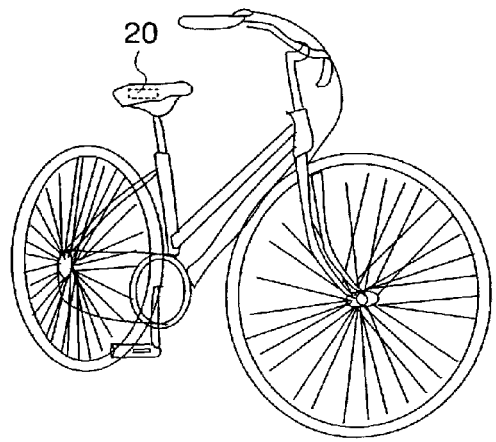
Figure 14H:
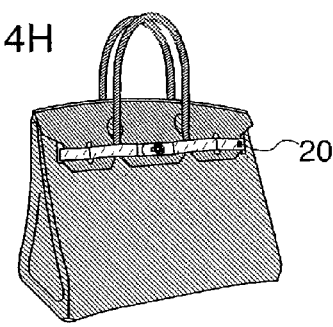

The paper money and coins are money distributed to the market and include one valid in a certain area (cash voucher), memorial coins, and the like. The securities refer to checks, certificates, promissory notes, and the like (FIG. 14A). The certificates refer to driver's licenses, certificates of residence, and the like (FIG. 14B). The bearer bonds refer to stamps, rice coupons, various gift certificates, and the like (FIG. 14C). The packing containers refer to wrapping paper for food containers and the like, plastic bottles, and the like (FIG. 14D). The books refer to hardbacks, paperbacks, and the like (FIG. 14E). The recording media refers to DVD software, video tapes, and the like (FIG. 14F). The vehicles refer to wheeled vehicles such as bicycles, ships, and the like (FIG. 14G). The personal belongings refer to bags, glasses, and the like (FIG. 14H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to a liquid crystal display device, an EL display device, a television device (a TV set and a flat-screen TV set), a cellular phone, and the like.

Forgery can be prevented by providing the paper money, the coins, the securities, the certificates, the bearer bonds, or the like with the semiconductor device. The efficiency of an inspection system, a system used in a rental shop, or the like can be improved by providing the packing containers, the books, the recording media, the personal belongings, the food, the commodities, the electronic devices, or the like with the semiconductor device. Forgery or theft can be prevented by providing the vehicles, the health products, the medicine, or the like with the semiconductor device; further, in a case of the medicine, medicine can be prevented from being taken mistakenly. The semiconductor device can be mounted on the foregoing article by being attached to the surface or being embedded therein. For example, in a case of a book, the semiconductor device may be embedded in a piece of paper; in a case of a package made from an organic resin, the semiconductor device may be embedded in the organic resin. By using a flexible semiconductor device, breakage or the like of an element included in the semiconductor device can be prevented even when the semiconductor device is mounted on paper or the like.

As described above, the efficiency of an inspection system, a system used in a rental shop, or the like can be improved by providing the packing containers, the recording media, the personal belonging, the food, the clothing, the commodities, the electronic devices, or the like with the semiconductor device. In addition, by providing the vehicles with the semiconductor device, forgery or theft can be prevented. Moreover, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

Figure 21:
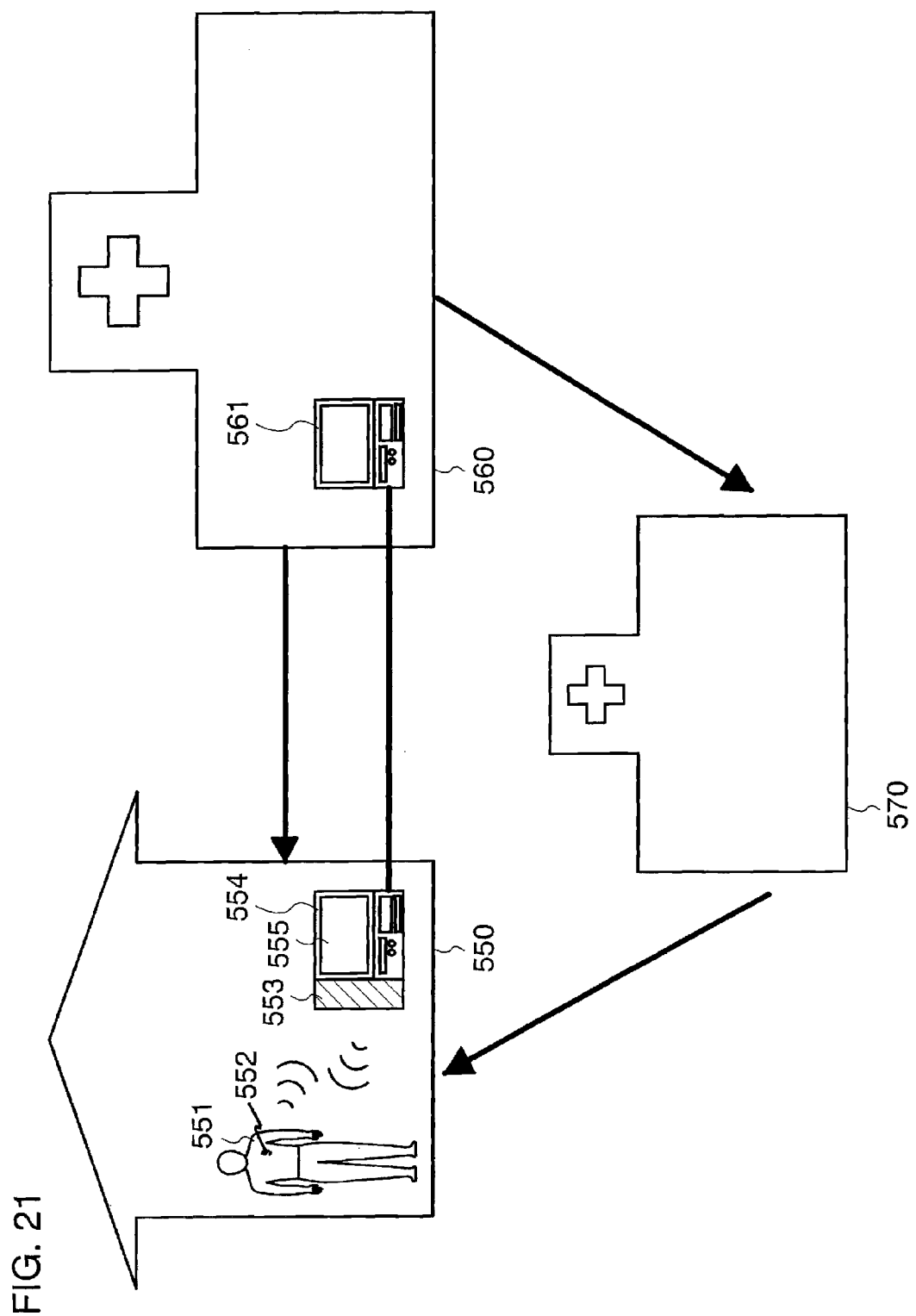
FIG. 21 is a view showing one example of a usage pattern of a semiconductor device according to the present invention.

Further, in addition to the above, a semiconductor device including an element for detecting pressure may be attached in vicinity of a heart to measure a heart rate. In addition, a semiconductor device of the present invention can be utilized in health care of a human body or prevention and a forecast of diseases by being applied to a human being. Moreover, a semiconductor device of the present invention can be utilized in a monitoring system for home-care or the like by obtaining information on a living body that is read out by a reader/writer with the use of a network such as Internet. A specific example thereof is shown in FIG. 21.

An individual 551 is made to carry a semiconductor device 552 that can detect physical quantity or chemical quantity. The semiconductor device 552 may be provided by being attached to a human body or implanted therein so that the individual 551 is appropriately selected to be provided. In addition, since blood, pulse, or the like is different among individuals, the semiconductor device 552 is provided in accordance with the individual 551. Accordingly, by making the individual 551 to carry the semiconductor device 552, information on a living body can be displayed in a display portion 555 of a device 554 such as a computer by reading out the information on a living body of the individual 551 that is detected by the semiconductor device 552 with a reader/writer 553. Further, the information on a living body that is read out can be transmitted from a home 550 to a medical institution 560 at a real time by using a network such as Internet.

The medical institution 560 monitors and manages information on the individual 551 by receiving the transmitted data by a device 561 such as a computer. In addition, a primary doctor and/or a medical specialist of the individual 551 can diagnose the individual 551 based on the transmitted information.

Accordingly, since the change in physical quantity or chemical quantity regarding a health condition of the individual 551 is detected regularly and transmitted to the medical institution 560, the medical institution 560 can monitor the health condition of the individual 551 even staying at home 550. Therefore, when any abnormality is found for the individual 551, it is possible to perform a detailed examination by dispatching a doctor immediately.

Still further, when the individual 551 always carries the semiconductor device 552, a health condition of the individual 551 can be grasped constantly even when the individual is away from home. In addition, when any abnormality is found for the individual 551, a doctor can be dispatched to the individual 551 immediately to offer treatment by exchanging information between the medical institution 560 where information on a living body of the individual 551 is managed and a medical institution 570 in vicinity of the individual 551. This is effective particularly when the individual 551 is out and when abnormality is found at the place except a home.

Furthermore, it is also possible to improve one lacked in the individual 551 by regularly managing the information on a living body of the individual 551. For example, when the present individual 551 lacks vitamin, this can be displayed in the display portion 555 to call attention and a foodstuff or the like to be taken in can also be displayed by managing and analyzing the information on a living body of the individual 551 by the device 554 such as a computer.

As described above, a health condition of the individual can be grasped not only by oneself but also by a medical institution or the like by making the individual always carry the semiconductor device 552 of the present invention. Thus, it is possible to prevent illness or the like and to provide the best treatment immediately even when an accidental disease or an accident occurs.

Note that it is also possible to subject the above semiconductor device to sealing treatment. For example, by performing sealing treatment with the use of a first sheet material 337 (also referred to as a film and a substrate) and a second sheet material 338 for the structure shown in FIG. 11C, it is possible to suppress a moisture, impurity element, or the like that enters a semiconductor element from the outside.

The first sheet material 337 and the second sheet material 338 used for sealing can be a film made from polypropylene, polyester, vinyl, polyvinyl fluoride, polyvinyl chloride, or the like, paper of a fibrous material, a laminated film of a base film (polyester, polyamide, an inorganic vapor-deposited film, paper, or the like) and an adhesive synthetic resin film (an acrylic-based synthetic resin, an epoxy-based synthetic resin, or the like), or the like. The film may be subjected to heat treatment and pressure treatment with an object to be treated. In performing heat treatment and pressure treatment, an adhesive layer provided over the uppermost surface of the film or a layer (not an adhesive layer) provided over the outermost layer is melted by heat treatment to be attached by applying pressure. An adhesive layer may be provided over the surface of the first sheet material 337 and the second sheet material 338, but it is not necessarily provided. The adhesive layer corresponds to a layer containing an adhesive such as a thermosetting resin, a UV curing resin, an epoxy-based resin, or a resin additive. The sheet material used for sealing is preferably coated with silica to prevent moisture or the like from entering the inside after sealing, and for example, a sheet material in which an adhesive layer, a film of polyester or the like, and silica coat are laminated can be used.

As the first sheet material 337 and the second sheet material 338, a film subjected to antistatic treatment for preventing static electricity or the like (hereinafter, referred to as an antistatic film) may be used as well. An antistatic film includes a film where an antistatic material is dispersed in a resin, a film to which an antistatic material is attached, and the like. A film containing an antistatic material may be a film having one side provided with an antistatic material, or a film having the both sides provided with an antistatic material. In a film having one side provided with an antistatic material, a layer may be attached so that the side provided with an antistatic material is attached to the inside or outside of the film. An antistatic material herein includes metal, oxide of indium and tin (ITO), and a surfactant such as a zwitterionic surfactant, a cationic surfactant, and a nonionic surfactant. Instead, a resin material containing a cross-linked copolymer high molecular compound having a carboxyl group and a quaternary ammonium base in a side chain may be used as an antistatic material. An antistatic film may be obtained by attaching, kneading, or applying these materials to a film. When a semiconductor device is sealed with an antistatic film, the semiconductor element can be protected from external static electricity or the like when being handled as a product.

In the sealing treatment, sealing of either surface may be performed selectively by using either the first sheet material 337 or the second sheet material 338. Besides, the sealing may be performed by using a glass substrate instead of the first sheet material 337. In this case, the glass substrate serves as a protective film, and it is possible to suppress a moisture or impurity element that enters a semiconductor element from the outside.

Note that this embodiment mode can be implemented by being arbitrarily combined with the above embodiment mode. In other words, the materials and the manufacturing methods shown in the above embodiment mode can be implemented by being arbitrarily combined with this embodiment mode, and the materials and the manufacturing methods shown in this embodiment mode can also be implemented by being arbitrarily combined with the above embodiment mode.

Embodiment Mode 4

This embodiment mode will explain a usage pattern of a semiconductor device of the present invention which differs from those in the above embodiment mode with reference to drawings. Specifically, a semiconductor device having a displaying means will be explained.

First, as a displaying means, a case of providing a pixel portion with a light-emitting element will be explained with reference to FIGS. 16A and 16B. Note that FIG. 16A shows a top view showing an example of a semiconductor device of the present invention, whereas FIG. 16B shows a cross-sectional view of FIG. 16A taken along lines a-b and c-d.

Figure 16A:
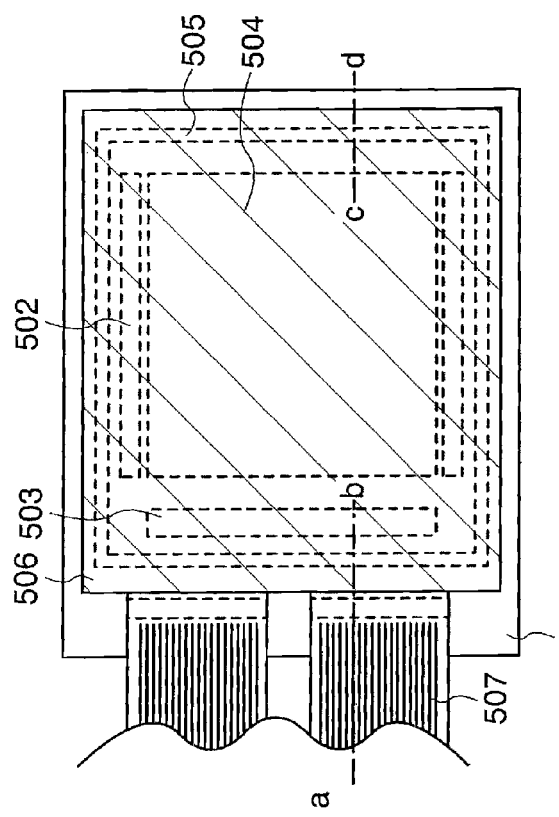
FIGS. 16A and 16B are views each showing one example of a usage pattern of a semiconductor device according to the present invention.

As shown in FIG. 16A, a semiconductor device shown in this embodiment mode includes a scanning line driver circuit 502, a signal line driver circuit 503, and a pixel portion 504 which are provided over a substrate 501. In addition, an opposite substrate 506 is provided so as to sandwich the pixel portion 504 with the substrate 501. The scanning line driver circuit 502, the signal line driver circuit 503, and the pixel portion 504 can be provided by forming thin film transistors each having any of the structures shown in the above embodiment mode. The substrate 501 and the opposite substrate 506 are attached to each other with a sealant 505.

The scanning line driver circuit 502 and the signal line driver circuit 503 receive a video signal, a clock signal, a start signal, a reset signal, or the like from an FPC (Flexible Printed Circuit) 507 serving as an external input terminal. Note that only the FPC is shown here; however, the FPC may be provided with a printed wiring board (PWB). In addition, as a thin film transistor, which forms the signal line driver circuit 503 or the scanning line driver circuit 502, a structure where thin film transistors are stacked can be employed as shown in the above embodiment mode. By providing thin film transistors by being stacked, an area in which the signal line driver circuit 503 or the scanning line driver circuit 502 is occupied can be reduced; therefore, the pixel portion 504 can be formed to have a large area.

Figure 16B:
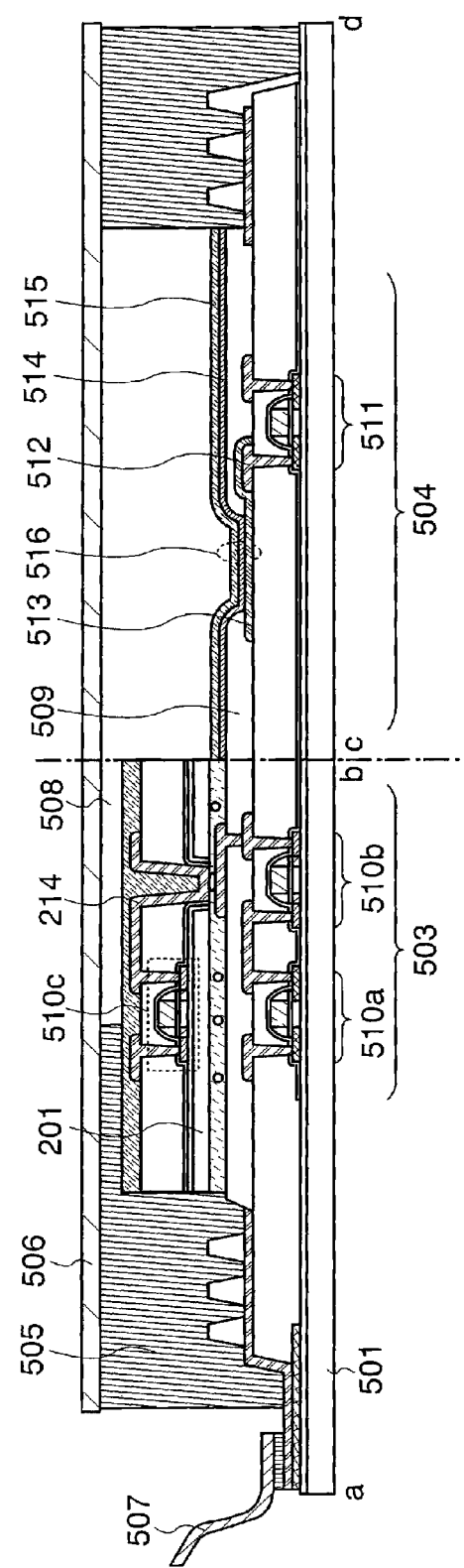

FIG. 16B is a schematic view of a cross section in FIG. 16A taken along lines a-b and c-d. Here, a case where the signal line driver circuit 503 and a thin film transistor included in the pixel portion 504 are provided over the substrate 501 is shown. A CMOS circuit that is a combination of an n-type thin film transistor 510a and a p-type thin film transistor 510b having any of the structure shown in the above embodiment mode is formed as the signal line driver circuit 503. Further, above the thin film transistors 510a and 501b, a thin film transistor 510c is provided by being stacked so as to be electrically connected to the thin film transistor 510b through a conductive film 214.

Note that the thin film transistor 510c and the thin film transistor 510b can be connected by any of the methods shown in the above embodiment mode. Here, the thin film transistor 510c provided over an upper surface of a substrate 201 is electrically connected to the thin film transistor 510b in a back surface of the substrate 201 through an opening formed in the substrate 201.

A thin film transistor that forms a driver circuit such as the scanning line driver circuit 502 or the signal line driver circuit 503 may be formed using a known CMOS circuit, PMOS circuit, or NMOS circuit. A driver integration type in which a driver circuit such as the scanning line driver circuit 502 or the signal line driver circuit 503 is formed over the substrate 501 is shown in this embodiment mode; however, it is not necessarily required, and a driver circuit can be formed outside the substrate 501 instead of over the substrate 501.

The pixel portion 504 is formed with a plurality of pixels each including a light-emitting element 516 and a thin film transistor 511 for driving the light-emitting element 516. A thin film transistor having any of the structures shown in the above embodiment mode can be applied to the thin film transistor 511. Here, a first electrode 513 is provided so as to be connected to a conductive film 512 connected to a source or drain region of the thin film transistor 511, and an insulating film 509 is formed to cover an end portion of the first electrode 513. The insulating film 509 serves as a partition in a plurality of pixels.

As the insulating film 509, a positive type photosensitive acrylic resin film is used here. The insulating film 509 is formed to have a curved surface at an upper end portion or a lower end portion thereof in order to make the coverage favorable. For example, in a case of using positive type photosensitive acrylic as a material of the insulating film 509, the insulating film 509 is preferably formed to have a curved surface with a curvature radius (0.2 to 3 μm) only at an upper end portion. Either a negative type which becomes insoluble in an etchant by light irradiation or a positive type which becomes soluble in an etchant by light irradiation can be used as the insulating film 509. Alternatively, the insulating film 509 can be provided with a single-layer structure of an organic material such as epoxy, polyimide, polyamide, polyvinylphenol, or benzocyclobutene, or a siloxane resin; or a stacked structure thereof. As shown in the above embodiment mode, the surface of the insulating film 509 can be modified to obtain a dense film by subjecting the insulating film 509 to plasma treatment and oxidizing or nitriding the insulating film 509. By modifying the surface of the insulating film 509, intensity of the insulating film 509 can be improved, and physical damage such as crack generation at the time of forming an opening or the like or film reduction at the time of etching can be reduced. In addition, by modifying the surface of the insulating film 509, interfacial quality such as adhesion with a light-emitting layer 514 to be provided over the insulating film 509 is improved.

In addition, in the semiconductor device shown in FIGS. 16A and 16B, the light-emitting layer 514 is formed over the first electrode 513, and a second electrode 515 is formed over the light-emitting layer 514. The light-emitting element 516 is provided with a stacked structure of the first electrode 513, the light-emitting layer 514, and the second electrode 515.

One of the first electrode 513 and the second electrode 515 is used as an anode, and the other is used as a cathode.

A material having a high work function is preferably used for an anode. For example, a single-layer film such as an ITO film, an indium tin oxide film containing silicon, a transparent conductive film formed by a sputtering method using a target in which indium oxide is mixed with zinc oxide (ZnO) of 2 to 20 wt %, a zinc oxide (ZnO) film, a titanium nitride film, a chromium film, a tungsten film, a Zn film, or a Pt film; a stacked layer of a film containing titanium nitride as its main component and a film containing aluminum as its main component; a three-layer structure of a titanium nitride film, a film containing aluminum as its main component, and another titanium nitride film; or the like. When a stacked structure is employed, an electrode can have low resistance as a wiring and form a favorable ohmic contact. Further, the electrode can serve as an anode.

A material having a low work function (Al, Ag, Li, Ca, or an alloy thereof such as MgAg, MgIn, AlLi, $CaF_2$, or calcium nitride) is preferably used for a cathode. In a case where an electrode used as a cathode is made to transmit light, a stacked layer of a metal thin film with a small thickness and a transparent conductive film (ITO, indium tin oxide containing silicon, a transparent conductive film formed by a sputtering method using a target in which indium oxide is mixed with zinc oxide (ZnO) of 2 to 20 wt %, zinc oxide (ZnO), or the like) is preferably used as the electrode.

Here, the first electrode 513 is formed using ITO which has a light-transmitting property as an anode, and light is extracted from the substrate 501 side. Note that light may be extracted form the opposite substrate 506 side by using a material having a light-transmitting property for the second electrode 515, or light can be extracted from both the substrate 501 side and the opposite substrate 506 side by forming the first electrode 513 and the second electrode 515 with a material having a light-transmitting property (this structure is referred to as dual emission).

The light-emitting layer 514 can be formed with a single layer or a stacked structure of a low molecular material, an intermediate molecular material (including an oligomer and a dendrimer), or a high molecular material (also referred to as a polymer) by a known method such as a vapor deposition method using an evaporation mask, an ink-jet method, or a spin coating method.

By attaching the substrate 501 to the opposite substrate 506 with the sealant 505, the light-emitting element 516 according to the present invention is provided in a space 508 surrounded by the substrate 501, the opposite substrate 506, and the sealant 505. Note that there are cases where the space 508 is filled with the sealant 505 as well as an inert gas (nitrogen, argon, or the like).

Note that an epoxy-based resin is preferably used as the sealant 505. The material preferably allows as little moisture and oxygen as possible to penetrate. As a material of the opposite substrate 506, a plastic substrate formed from FRP (Fiberglass-Reinforced Plastics), PVF (polyvinyl fluoride), Myler, polyester, acrylic, or the like can be used besides a glass substrate or a quartz substrate.

Note that the semiconductor device including a pixel portion is not limited to the above structure using a light-emitting element in a pixel portion, and it also includes a semiconductor device using a liquid crystal in a pixel portion. The semiconductor device using a liquid crystal in a pixel portion is shown in FIG. 17.

Figure 17:
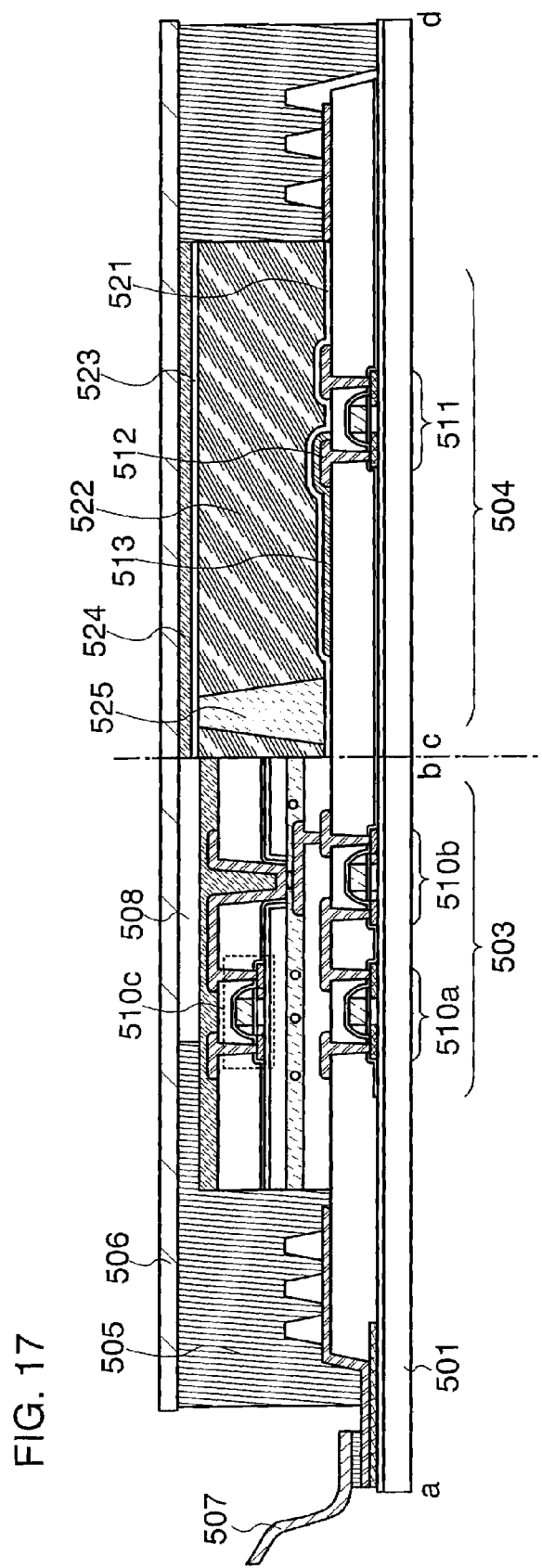
FIG. 17 is a view showing one example of a usage pattern of a semiconductor device according to the present invention.

FIG. 17 shows one example of a semiconductor device having a liquid crystal in a pixel portion. A liquid crystal 522 is provided between an orientation film 521 provided to cover a conductive film 512 and a first electrode 513 and an orientation film 523 provided over an opposite substrate 506. In addition, a second electrode 524 is provided over the opposite substrate 506. An image is displayed by controlling light transmittance by controlling a voltage applied to the liquid crystal provided between the first electrode 513 and the second electrode 524. Moreover, a spacer 525 is provided in the liquid crystal 522 to control the distance (cell gap) between the first electrode 513 and the second electrode 524. Note that any of the structures described in the above embodiment mode can be applied to thin film transistors 510a, 510b, 510c, and 511.

As described above, in the semiconductor device shown in this embodiment mode, the pixel portion can be provided with a light-emitting element or a liquid crystal.

Figure 15A:
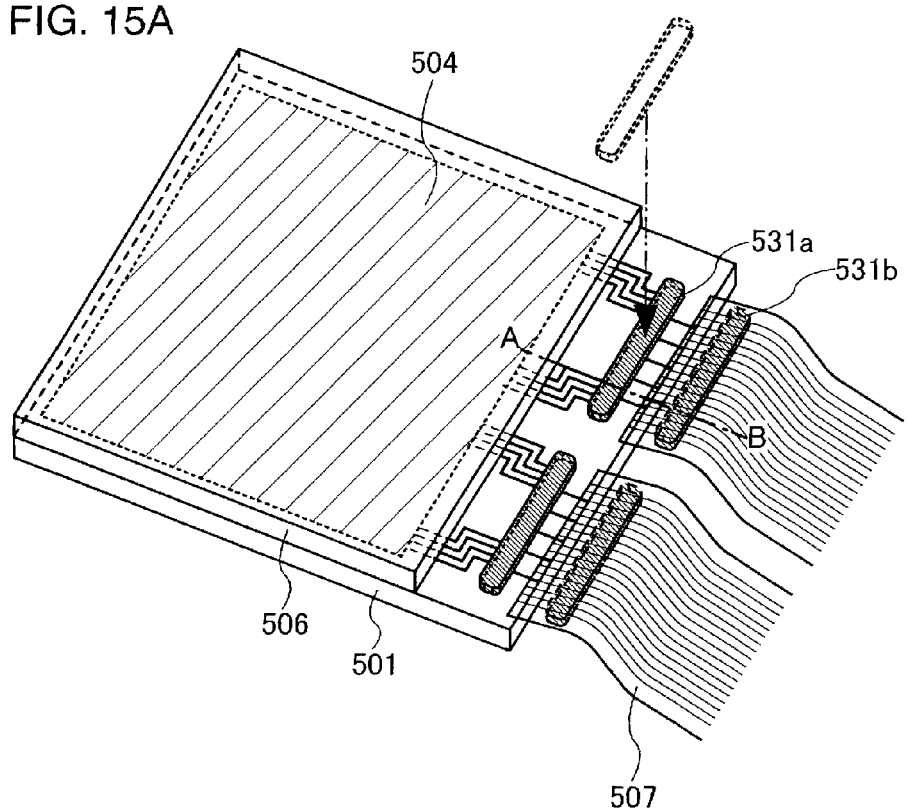
FIGS. 15A and 15B are views each showing one example of a usage pattern of a semiconductor device according to the present invention.
Figure 15B:
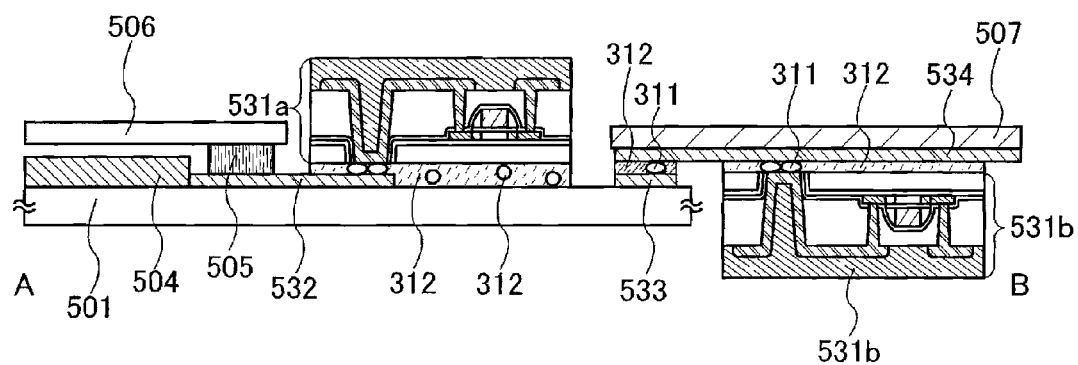

In addition, the above FIGS. 16A and 16B and FIG. 17 each show a driver integration type formed of a driver circuit such as a scanning line driver circuit or a signal line driver circuit formed over a substrate; however, the driver circuit can also be formed by being attached to a substrate instead of forming over a substrate. One example of a display device of this case will be explained with reference to FIGS. 15A and 15B. Note that FIG. 15B shows a schematic view of a cross section in FIG. 15A taken along a line A-B.

A semiconductor element 531a is provided by being attached over a substrate 501, and a semiconductor element 531b is provided by being attached over an FPC 507 serving as a connection film. A pixel portion 504 and the semiconductor element 531a are connected through a conductive film 532 over the substrate 501. The semiconductor element 531a and the semiconductor element 531b are connected through a conductive film 533 over the substrate 501 and a conductive film 534 over the FPC 507. For connection of these conductive films, a resin 312 containing conductive particles 311 can be used. Besides, as described above, a conductive adhesive such as a silver paste, a copper paste, or a carbon paste; a conductive adhesive such as an ACP; a conductive film such as an ACF; a solder connection; or the like can be used. In addition, the substrate 501 and an opposite substrate 506 are attached with a sealant 505.

Next, usage patterns of a semiconductor device having the above pixel portion will be explained with reference to drawings.

The followings can be given as usage patterns of a semiconductor device having the above pixel portion: a camera such as a video camera or a digital camera, a goggle type display (head mounted display), a navigation system, an audio reproducing device (car audio, an audio component, and the like), a computer, a game machine, a portable information terminal (a mobile computer, a cellular phone, a portable game machine, an electronic book, and the like), an image reproducing device provided with a recording medium (specifically, a device capable of processing data in a recording medium such as a digital versatile disc (DVD) and having a display which can display the image of the data), and the like. Specific examples thereof will be hereinafter shown.

Figure 18A:
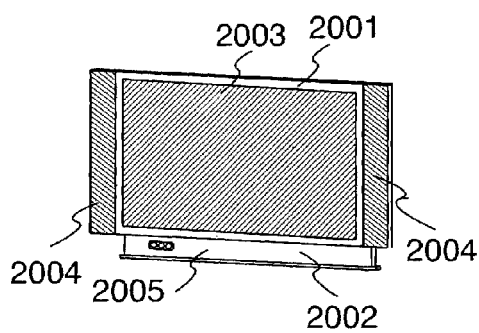
FIGS. 18A to 18G are views each showing one example of a usage pattern of a semiconductor device according to the present invention.

FIG. 18A shows a television receiver, which includes a housing 2001, a supporting stand 2002, a display portion 2003, speaker portions 2004, a video input terminal 2005, and the like. The television receiver, which is one usage pattern of a semiconductor device of the present invention, can be manufactured by applying the structure or the manufacturing method of the semiconductor device shown in this embodiment mode or the above embodiment mode to the display portion 2003, a driver circuit, or the like.

Figure 18B:
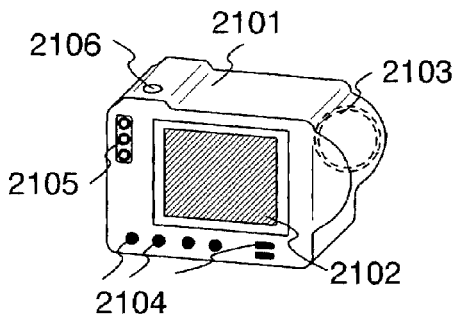

FIG. 18B shows a digital camera, which includes a main body 2101, a display portion 2102, an image receiving portion 2103, operation keys 2104, an external connection port 2105, a shutter 2106, and the like. The digital camera, which is one usage pattern of a semiconductor device of the present invention, can be manufactured by applying the structure or the manufacturing method of the semiconductor device shown in this embodiment mode or the above embodiment mode to the display portion 2102, a driver circuit, or the like.

Figure 18C:
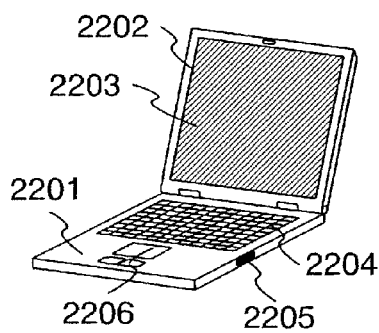

FIG. 18C shows a computer, which includes a main body 2201, a housing 2202, a display portion 2203, a keyboard 2204, an external connection port 2205, a pointing mouse 2206, and the like. The computer, which is one usage pattern of a semiconductor device of the present invention, can be manufactured by applying the structure or the manufacturing method of the semiconductor device shown in this embodiment mode or the above embodiment mode to the display portion 2203, a driver circuit, or the like.

Figure 18D:
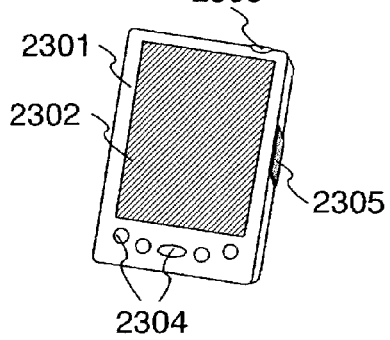

FIG. 18D shows a mobile computer, which includes a main body 2301, a display portion 2302, a switch 2303, operation keys 2304, an infrared port 2305, and the like. The mobile computer, which is one usage pattern of a semiconductor device of the present invention, can be manufactured by applying the structure or the manufacturing method of the semiconductor device shown in this embodiment mode or the above embodiment mode to the display portion 2302, a driver circuit, or the like.

Figure 18E:
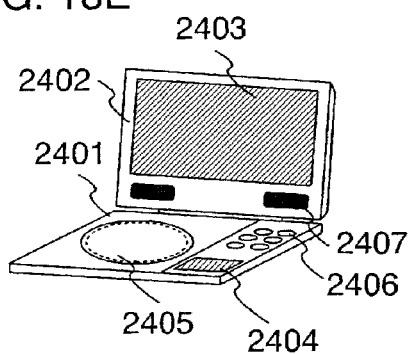

FIG. 18E shows a portable image reproducing device having a recording medium (a DVD reproducing device or the like), which includes a main body 2401, a housing 2402, a display portion A 2403, a display portion B 2404, a recording medium (DVD or the like) reading portion 2405, operation keys 2406, speaker portions 2407, and the like. The display portion A 2403 mainly displays image information, and the display portion B 2404 mainly displays textual information. The image reproducing device, which is one usage pattern of a semiconductor device of the present invention, can be manufactured by applying the structure or the manufacturing method of the semiconductor device shown in this embodiment mode or the above embodiment mode to the display portion A 2403, the display portion B 2404, a driver circuit, or the like. Note that the image reproducing device having a recording medium includes a game machine or the like.

Figure 18F:
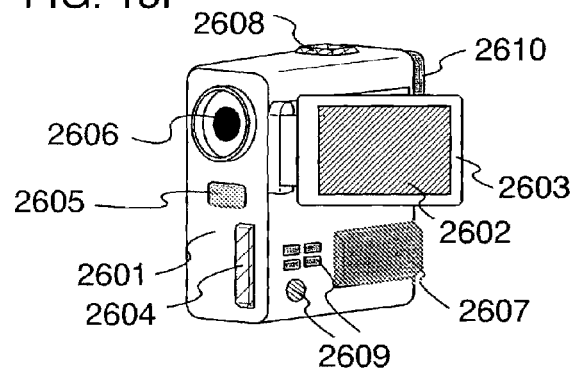

FIG. 18F shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eye piece portion 2610, and the like. The video camera, which is one usage pattern of a semiconductor device of the present invention, can be manufactured by applying the structure or the manufacturing method of the semiconductor device shown in this embodiment mode or the above embodiment mode to the display portion 2602, a driver circuit, or the like.

Figure 18G:
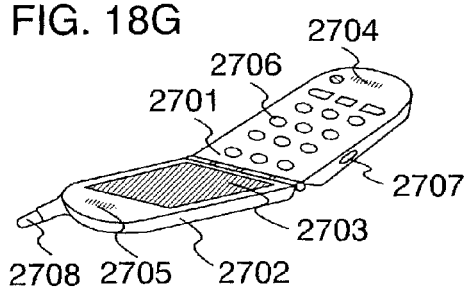

FIG. 18G shows a cellular phone handset, which includes a main body 2701, a housing 2702, a display portion 2703, an audio input portion 2704, an audio output portion 2705, operation keys 2706, an external connection port 2707, an antenna 2708, and the like. The cellular phone handset, which is one usage pattern of a semiconductor device of the present invention, can be manufactured by applying the structure or the manufacturing method of the semiconductor device shown in this embodiment mode or the above embodiment mode to the display portion 2703, a driver circuit, or the like.

A semiconductor device of the present invention can be made flexible by thinning a substrate. Hereinafter, a specific example of a flexible semiconductor device having a pixel portion will be explained with reference to drawings.

Figure 19A:
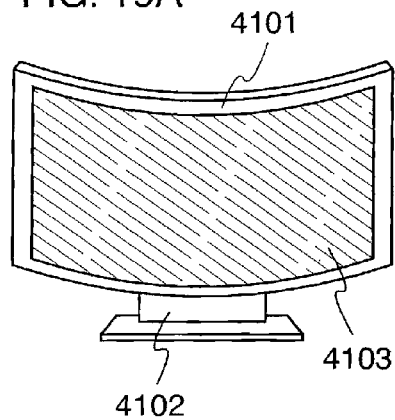
FIGS. 19A to 19F are views each showing one example of a usage pattern of a semiconductor device according to the present invention.

FIG. 19A shows a display, which includes a main body 4101, a supporting stand 4102, a display portion 4103, and the like. The display portion 4103 is formed using a flexible substrate, which can realize a lightweight and thin display. In addition, the display portion 4103 can be curved, and can be detached from the support 4102 and the display can be mounted along a curved wall. Thus, the flexible display can be provided over a curved portion as well as a flat surface; therefore, it can be used for various applications. A flexible display, which is one usage pattern of a semiconductor device of the present invention, can be manufactured by using the flexible semiconductor device shown in this embodiment mode or the above embodiment mode for the display portion 4103, a circuit, or the like.

Figure 19B:
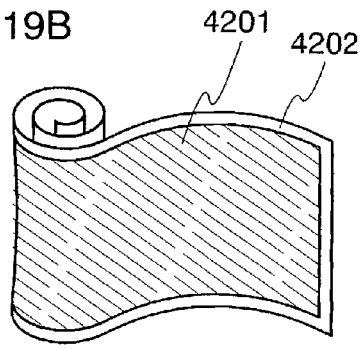

FIG. 19B shows a display that can be wound, which includes a main body 4201, a display portion 4202, and the like. Since the main body 4201 and the display portion 4202 are formed using a flexible substrate, the display can be carried in a bent or wound state. Therefore, even in a case where the display is large-size, the display can be carried in a bag in a bent or wound state. A flexible, lightweight, and thin large-sized display, which is one usage pattern of a semiconductor device of the present invention, can be manufactured by using the flexible semiconductor device shown in this embodiment mode or the above embodiment mode for the display portion 4202, a circuit, or the like.

Figure 19C:
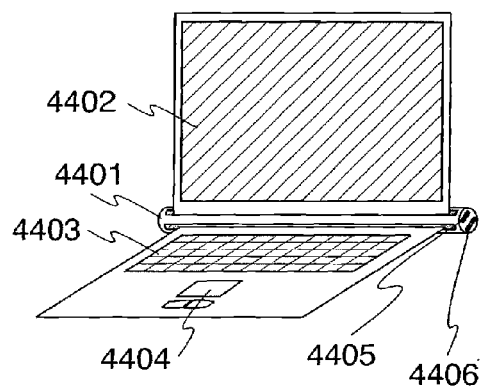

FIG. 19C shows a sheet-type computer, which includes a main body 4401, a display portion 4402, a keyboard 4403, a touch pad 4404, an external connection port 4405, a power plug 4406, and the like. The display portion 4402 is formed using a flexible substrate, which can realize a lightweight and thin computer. In addition, the display portion 4402 can be wound and stored in the main body by providing a portion of the main body 4401 with a storage space. Moreover, also by forming the keyboard 4403 to be flexible, the keyboard 4403 can be wound and stored in the storage space of the main body 4401 in a similar manner to the display portion 4402, which is convenient for carrying around. The computer can be stored without taking a place by bending when it is not used. A flexible, lightweight, and thin computer, which is one usage pattern of a semiconductor device of the present invention, can be manufactured by using the flexible semiconductor device shown in this embodiment mode or the above embodiment mode for the display portion 4402, a circuit, or the like.

Figure 19D:
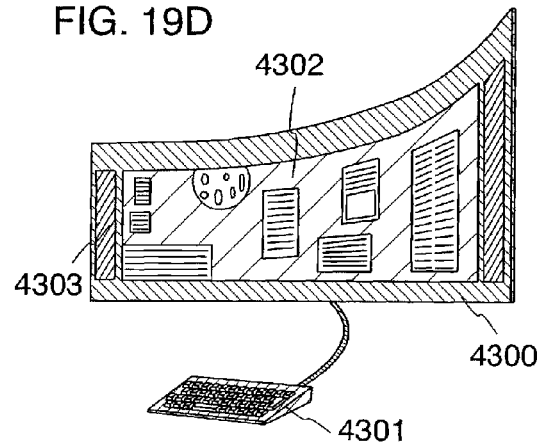

FIG. 19D shows a display device having a 20 to 80-inch large-sized display portion, which includes a main body 4300, a keyboard 4301 that is an operation portion, a display portion 4302, a speaker 4303, and the like. The display portion 4302 is formed using a flexible substrate, and the main body 4300 can be carried in a bent or wound state with the keyboard 4301 detached. In addition, the connection between the keyboard 4301 and the display portion 4302 can be performed without wires. For example, the main body 4300 can be mounted along a curved wall and can be operated with the key board 4301 without wires. In this case, a flexible, lightweight, and thin large-sized display device, which is one usage pattern of a semiconductor device of the present invention, can be manufactured by using the flexible semiconductor device shown in this embodiment mode or the above embodiment mode for the display portion 4302, a circuit, or the like.

Figure 19E:
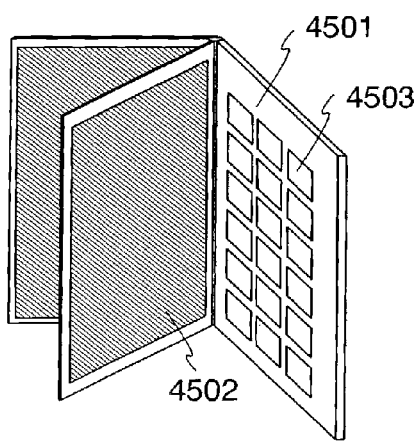

FIG. 19E shows an electronic book, which includes a main body 4501, a display portion 4502, operation keys 4503, and the like. In addition, a modem may be incorporated in the main body 4501. The display portion 4502 is formed using a flexible substrate and can be bent or wound. Therefore, the electronic book can also be carried without taking a place. Further, the display portion 4502 can display a moving image as well as a still image such as a character. A flexible, lightweight, and thin electronic book, which is one usage pattern of a semiconductor device of the present invention, can be manufactured by using the flexible semiconductor device shown in this embodiment mode or the above embodiment mode for the display portion 4502, a circuit, or the like.

Figure 19F:
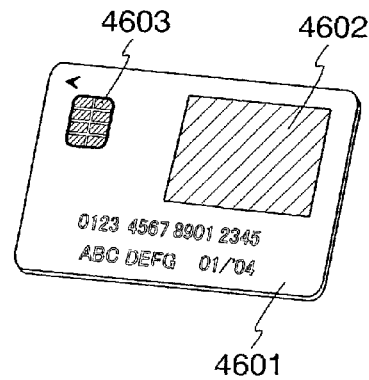

FIG. 19F shows an IC card, which includes a main body 4601, a display portion 4602, a connection terminal 4603, and the like. Since the display portion 4602 is formed to be a lightweight and thin sheet type using a flexible substrate, it can be formed over a card surface by attachment. When the IC card can receive data without contact, information obtained from the outside can be displayed on the display portion 4602. A flexible, lightweight, and thin IC card, which is one usage pattern of a semiconductor device of the present invention, can be manufactured by using the flexible semiconductor device shown in this embodiment mode or the above embodiment mode for the display portion 4602, a circuit, or the like.

As described above, an applicable range of a semiconductor device of the present invention is so wide that the semiconductor device of the present invention can be applied to electronic devices of various fields. Note that this embodiment mode can be implemented by being arbitrarily combined with the above embodiment mode.

The present application is based on Japanese Patent Application serial No. 2005-222199 filed on Jul. 29, 2005 in Japanese Patent Office, the entire contents of which are hereby incorporated by reference.

What is claimed is:

1. A semiconductor device comprising:
   a substrate including a first opening, wherein a thickness of the substrate is 1 µm to 100 µm;
   a first transistor over the substrate;
   a first insulating film over the first transistor, the first insulating film including a second opening and a third opening;
   a first conductive film over the first insulating film and in the first opening and the second opening, the first conductive film electrically connected to one of a source and a drain of the first transistor through the third opening; and
   a second insulating film, covering the first transistor, between the first transistor and the first insulating film,
   wherein the first opening and the second opening overlap with each other,
   wherein the first conductive film penetrates an upper surface of the substrate through a back surface of the substrate, and
   wherein the second insulating film faces a side surface of the substrate in the first opening.

2. The semiconductor device according to claim 1, further comprising:
   a second conductive film over the first insulating film and in the third opening,
   wherein the second conductive film is in contact with the first conductive film.

3. The semiconductor device according to claim 1, further comprising:
   a second transistor under the substrate, the second transistor electrically connected to the first conductive film in the first opening.

4. The semiconductor device according to claim 3, wherein the second transistor is electrically connected to the first conductive film through a conductive particle.

5. A display device comprising:
   the semiconductor device according to claim 1,
   wherein a flexible substrate is used for a display portion of the display device.

6. A display device comprising:
   the semiconductor device according to claim 1,
   wherein a display portion of the display device mounts along a curved wall.

7. A semiconductor device comprising:
   a substrate including a first opening, the substrate having flexibility;
   a first transistor over the substrate;
   a first insulating film over the first transistor, the first insulating film including a second opening and a third opening;
   a first conductive film over the first insulating film and in the first opening and the second opening, the first conductive film electrically connected to one of a source and a drain of the first transistor through the third opening; and
   a second insulating film, covering the first transistor, between the first transistor and the first insulating film,
   wherein the first opening and the second opening overlap with each other,
   wherein the first conductive film penetrates an upper surface of the substrate through a back surface of the substrate, and
   wherein the second insulating film faces a side surface of the substrate in the first opening.

8. The semiconductor device according to claim 7, further comprising:
   a second conductive film over the first insulating film and in the third opening,
   wherein the second conductive film is in contact with the first conductive film.

9. The semiconductor device according to claim 7, further comprising:
   a second transistor under the substrate, the second transistor electrically connected to the first conductive film in the first opening.

10. The semiconductor device according to claim 9, wherein the second transistor is electrically connected to the first conductive film through a conductive particle.

11. A display device comprising:
    the semiconductor device according to claim 7.

12. A display device comprising:
    the semiconductor device according to claim 7,
    wherein a display portion of the display device mounts along a curved wall.

13. A semiconductor device comprising:
a substrate including a first opening;
a first transistor over the substrate;
a first insulating film over the first transistor, the first insulating film including a second opening and a third opening;
a first conductive film over the first insulating film and in the first opening and the second opening, the first conductive film electrically connected to one of a source and a drain of the first transistor through the third opening;
a flexible printed circuit (FPC) under the substrate, the FPC electrically connected to the first transistor through the first conductive film in the first opening; and
a second insulating film, covering the first transistor, between the first transistor and the first insulating film,
wherein the first opening and the second opening overlap with each other,
wherein the first conductive film penetrates an upper surface of the substrate through a back surface of the substrate, and
wherein the second insulating film faces a side surface of the substrate in the first opening.

14. The semiconductor device according to claim 13, further comprising:
a second conductive film over the first insulating film and in the third opening,
wherein the second conductive film is in contact with the first conductive film.

15. The semiconductor device according to claim 13, wherein the FPC is electrically connected to the first conductive film through a conductive particle.

16. A display device comprising:
the semiconductor device according to claim 13,
wherein a flexible substrate is used for a display portion of the display device.

17. A display device comprising:
the semiconductor device according to claim 13,
wherein a display portion of the display device mounts along a curved wall.

* * * * *